US006630710B1

(12) United States Patent
Augusto

(10) Patent No.: US 6,630,710 B1
(45) Date of Patent: Oct. 7, 2003

(54) ELEVATED CHANNEL MOSFET

(75) Inventor: Carlos Augusto, Newport Beach, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 09/616,233

(22) Filed: Jul. 14, 2000

Related U.S. Application Data

(62) Division of application No. 09/162,272, filed on Sep. 29, 1998, now Pat. No. 6,143,593.

(51) Int. Cl.[7] ............................................. H01L 29/778
(52) U.S. Cl. ..................... 257/327; 257/345; 438/227
(58) Field of Search ..................... 257/327, 288–289, 257/368–369, 371, 408–413, 345; 438/227

(56) References Cited

U.S. PATENT DOCUMENTS

| | | | |
|---|---|---|---|
| 5,362,981 A | | 11/1994 | Sato et al. |
| 5,534,713 A | * | 7/1996 | Ismail et al. .................. 257/24 |
| 5,576,227 A | | 11/1996 | Hsu |
| 5,646,073 A | | 7/1997 | Grider et al. |
| 5,766,967 A | * | 6/1998 | Iai et al. ...................... 437/415 |
| 5,898,202 A | * | 4/1999 | Fulford, Jr. et al. ......... 257/408 |
| 5,960,270 A | | 9/1999 | Misra et al. |
| 5,982,004 A | * | 11/1999 | Sin et al. ...................... 257/347 |
| 5,994,179 A | | 11/1999 | Masuoka |
| 6,004,137 A | * | 12/1999 | Crabbe et al. ............... 438/158 |
| 6,010,923 A | * | 1/2000 | Jinno ........................... 438/158 |
| 6,222,240 B1 | * | 4/2001 | Gardner et al. .............. 257/410 |

FOREIGN PATENT DOCUMENTS

| | | |
|---|---|---|
| EP | 0274 278 A1 | 7/1988 |
| EP | 0730 307 A2 | 9/1996 |
| JP | 09 321151 A | 12/1997 |

OTHER PUBLICATIONS

Ray, S.K., et al., "Novel SiGeC Channel Heterojunction PMOSFET", International Electron Devices Meeting (IEDM), US, New York, IEEE, 1996, pp. 261–264.

Lu, C.Y., et al., "Process Integration", ULSI Technology, 1996, pp. 472–525.

* cited by examiner

Primary Examiner—Minhloan Tran
Assistant Examiner—Thomas L Dickey
(74) Attorney, Agent, or Firm—Farjami & Farjami LLP

(57) ABSTRACT

The present invention provides a semiconductor device (e.g., MOSFET) having a channel above the surface of the wafer containing a well and a junction. The elevated channel may be selectively epitaxially grown and enables higher mobility, thereby enabling a higher current flow at a lower voltage through the device. The process flow of the invention provides for the implantation and thermal processing of the wells and junctions prior to the growth of a channel or the deposition of a gate stack. By implanting and annealing the wells and junctions prior to the formation of the channel and gate, a greater variety of materials are available for the channel and gate, e.g., undoped materials may be used to form the channel, metal oxides and similar materials with large dielectrics may be used to form a gate stack, and barrier metals and pure metals (copper, tungsten, etc.) may be used as gate electrodes.

22 Claims, 26 Drawing Sheets

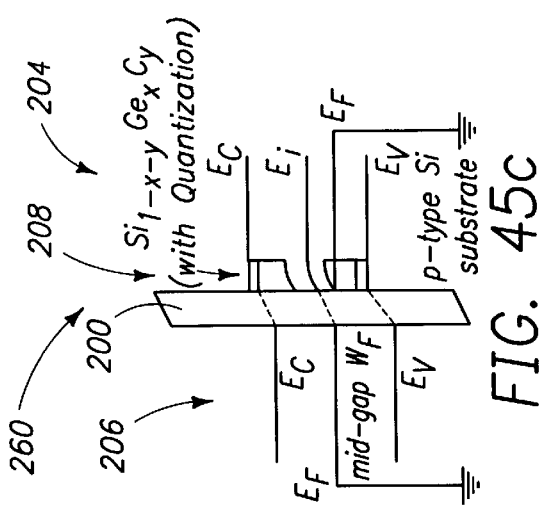
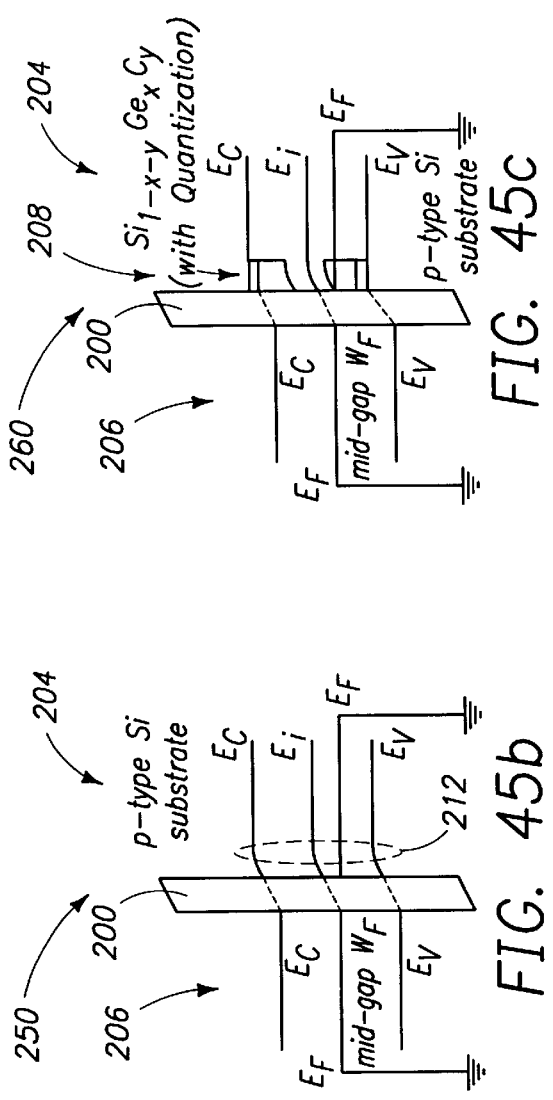
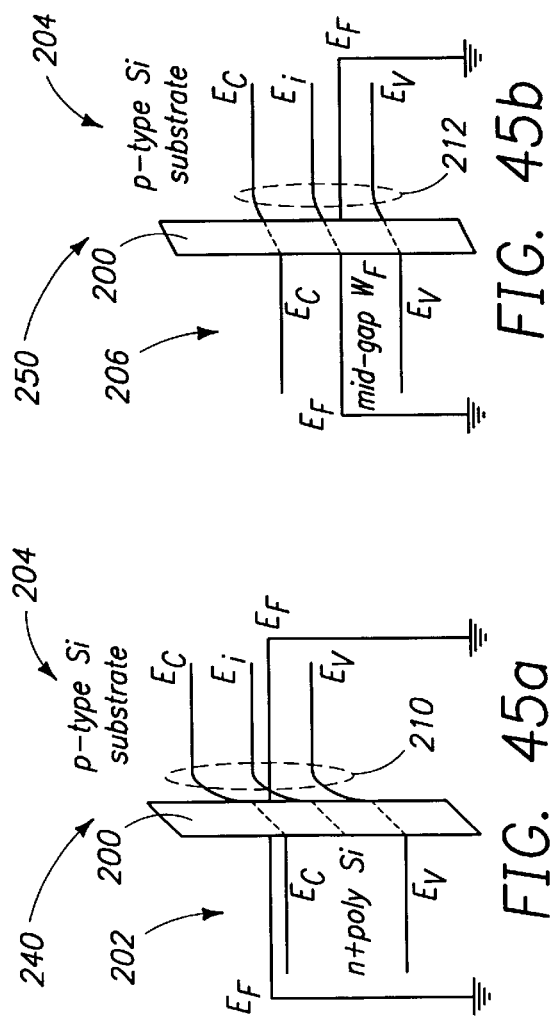
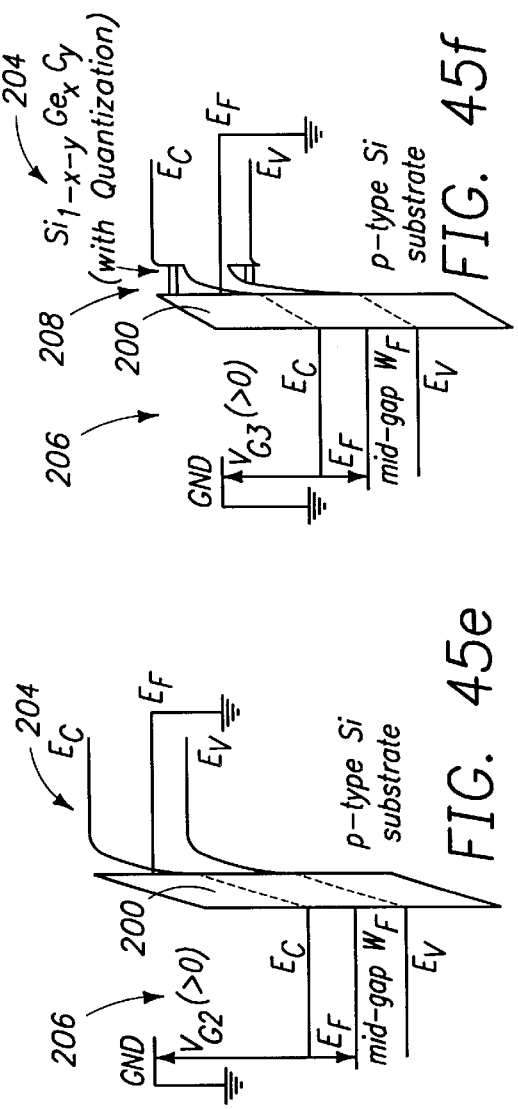

ELEVATED CHANNEL MOSFET

REFERENCE TO RELATED DOCUMENTS

This application is a divisional application of U.S. patent application Ser. No. 09/162,272, filed, now U.S. Pat. No. 6,143,593 Sep. 29, 1998 and entitled "ELEVATED CHANNEL MOSFET"

TECHNICAL FIELD

The present invention generally relates to a new method of forming semiconductor devices in silicon structures. More particularly, the present invention relates to a new method of forming semiconductor devices with gate lengths scaled to 0.25 microns or below.

BACKGROUND OF THE INVENTION

Since the advent of the semiconductor, scientists and engineers have strived to reduce the power consumption of semiconductor devices, e.g., Metal Oxide Semiconductor Field Effect Transistors (MOSFETs). Since the amount of power consumed by a MOSFET is proportional to the size of the device, the goal of reducing power demands has resulted in a goal of obtaining ever smaller MOSFETs.

Today, it is common to manufacture MOSFETs on the scale of 0.25 microns (wherein a MOSFET's size is characterized by the length of its gate). To date, these reductions in MOSFET sizes have principally resulted from improvements in the equipment and apparatus used to manufacture semiconductors. The basic process flow of manufacturing MOSFETs has remained substantially unchanged since the introduction of the poly-silicon gate which enables self-aligned flow. The current method of producing a MOSFET on a polished silicon wafer encompasses numerous individual steps which are often grouped into major process steps. These process steps commonly begin with an undoped silicon wafer 10, as shown in FIG. 1a, on which a pad oxide layer 11 and a nitride layer 13 are formed.

The process, which the present invention addresses, specifically begins with isolation, wherein the undoped silicon wafer 10 is divided by a number of isolation regions 12 (such as $SiO_2$) into separate areas in which individual devices are to be located, as shown in FIG. 1b.

After isolation, a sacrificial oxide is often suitably deposited above the active regions; followed by the implantantation of the deep well. Well implantation determines the electrical properties of the device (i.e., whether the transistor will be NMOS or PMOS). For example, an NMOS has a p-doped well 16 (identified by the "p") and a PMOS has an n-doped well 18 (identified by the "n"), as shown in FIG. 1c.

After well implantation, the gate stack is commonly formed. A gate oxide 20 is grown in the location where the channel will eventually be formed. A poly-silicon layer 22 is then deposited on top of the gate oxide 20, as shown in FIG. 1d.

After formation of the gate stack, the gate (the combination of the gate oxide 20 and the poly-silicon 22) is patterned, as shown in FIG. 1e. This step basically determines the length of the gate 22, and designates the level of technology (i.e., in the realm of semiconductor devices, the gate length is commonly used as a benchmark of the technology, wherein a smaller gate length indicates a more advanced technology).

After forming and patterning the gate, the source and drain are implanted. Source and drain implantation commonly occurs in two steps, the first of which is commonly referred to as the implantation of Lightly Doped Drains and Source (LDDS). In this step, lightly doped regions 25 are created on either side of the gate, as shown in FIG. 1f. The device structure is then commonly subjected to Rapid Thermal Processing (RTP), which anneals defects cause by ion implantation and electrically actives the doping impurities. In the second step of source and drain implantation, spacers 26 are formed on either side of the gate and then highly doped junction regions 27 are implanted using known techniques and do pants, as shown in FIG. 1g. The junctions are then thermally annealed using known annealing processes.

After implanting the source and drain, the last step provides for the formation of ohmic contacts through self-aligned silicidation. During silicidation, the region above the source, drain, and the poly-silicon gate are covered with a low resistivity metallic silicide film 30, as shown in FIG. 1h. The spacers 26 physically and electrically separate the gate 20/22 from the source and drain junctions 25/27.

While the process described in detail above has proven to be an effective method of producing MOSFETs on the scale of 0.18 microns, utilizing this process has proven to be highly undesirable and faces tremendous technological hurdles when applied on scales of less than 0.13 microns. One of these hurdles is the short channel effect, which often occurs when the length of the gate decreases below 0.13 microns. As the gate length decreases, the depletion regions (i.e., the regions of the source and drain under the gate) merge and the gate loses control of the current.

One approach at preventing the short channel effect from occurring is to shrink the depth of the channel between the source and the drain. While shrinking the channel depth has proven feasible for devices with gate lengths as small as 0.25 microns, for devices smaller than 0.13 microns significant fabrication difficulties often arise. Some of these difficulties are due to the diffusion properties of boron and other potential p-type do pants (gallium and indium) in silicon. In the standard process flow, Rapid Thermal Processing (RTP) is commonly used to electrically activate do pants and anneal any defects which may have occurred during the various deposition stages. When RTP is utilized on a boron laced substrate, however, excessive diffusion often occurs and the channel widens, thereby giving rise to the short channel effect.

In addition to controlling the diffusion of boron in the channel, the profiles under the gate also need to be sharper with, ideally, the lowest concentration possible occurring at the silicon/gate insulator interface. FIG. 2a shows a shallow profile 32 and FIG. 2b shows the desired steep profile 34. FIG. 2c shows a relative graph (for illustrative purpose only, and not to reflect actual doping profiles) of the doping concentration versus the depth of the structure for a shallow profile (i.e., along the line A—A in FIG. 2a) and a deep profile (i.e., along the line B—B in FIG. 2b). As shown in FIG. 2c, the shallow profile 32 ("A—A") has a lower doping concentration in the substrate closest to the gate oxide (i.e., the area of the graph indicated by "100") and a larger doping concentration deeper in the substrate (i.e., area "102"). In contrast, the steep profile 34 (i.e., "B—B" or area "104") has a constant doping concentration throughout the substrate. In standard, CMOS devices, the shallow profile (i.e., "A—A") is desired because it helps suppress punch through. However, in <0.13 micron generation transistors, the steep profile 34 is desired because it results in better charge carrier mobility and therefore a higher current drive capability.

Under currently available methods, these steeper profiles can be obtained via two methods, Super Steep Retrograde Well (SSRW) and Super Halo. However, neither of these approaches is suitable for <0.13 micron architectures. SSRW is unsuitable for <0.13 micron generation transistors because in order to achieve the sharp profiles desired, SSRW requires numerous thermal cycles which diffuse do pants and often give rise to the short channel effect. Similarly, the Super Halo method requires very abrupt doping profiles under the gate and junctions of the MOSFET which can be very difficult to obtain with current process flows. Therefore, currently available processes and systems can not make profiles suitable for the <0.13 micron generation.

Another problem encountered in producing devices in the <0.13 micron generation using the present method arises from the lightly doped extensions of the source and drain into the channel (for example, see FIG. 1f, item 25). Originally, these lightly doped extensions were introduced to prevent the Hot Carrier Effect (HCE). HCE is the phenomenon which occurs in silicon when charge carriers in the drain are accelerated by a high energy field. The charge carriers often become hot, overcome the gate oxide barrier, and inject into the gate. HCE will ultimately degrade the performance of the device to the point of unreliability.

HCE, however, is less of a concern in devices with low operating voltages. Since the operating voltage of the device decreases as the gate length decreases, in <0.13 micron devices, the electric field generated does not accelerate the charge carriers to the point of thermal break through. Additionally, as the gate voltage of the device decreases, the series resistance of the source and drain regions becomes ever more important when compared to the resistance of the inversion layer.

Since the current drive is proportional to the voltage divided by the resistance (I=V/R), it is desirable to decrease the resistance and thus maintain a high current drive in a low voltage device. Therefore, for <0.13 micron generation devices it is desirable to have steep, highly doped sources and drains. As previously stated, fabricating such regions using currently available methods is extremely difficult.

Additionally, for very low voltage circuits (1 Volt and below) it is expected that silicon dioxide, the MOS gate insulator commonly used, will be replaced by another material with a larger dielectric constant. The most promising candidates to replace $SiO_2$ are metal oxides. Unfortunately, metal oxides generally can not be simply introduced into the current process flow in place of $SiO_2$. Chemical, mechanical, and electrical stability problems and contamination concerns make integration of metal oxides into the current process flow difficult and problematic. Since $SiO_2$ has proven to be highly undesirable for low power devices, the inability of the current processes to efficiently utilize metal oxides may retard the introduction of low power circuits, especially those to be powered by batteries.

The factors identified above create extreme difficulties in producing semiconductor devices <0.13 micron in size using the conventional process flow. Therefore, a process flow for producing semiconductor devices for the <0.13 micron generation is needed.

SUMMARY OF THE INVENTION

In accordance with the present invention, a process flow for producing a MOSFET is provided which overcomes many of the shortcomings and limitations of the prior art and provides a process flow for producing <0.13 micron generation semiconductor devices. The process flow of the present invention utilizes an unconventional sequence of fabrication steps. Additionally, a new process step, the Selective Epitaxial Growth (SEG) of the channel material, is provided which may be suitably incorporated into either the prior art process flow or the new process flow of the present invention.

The new process flow encompasses many of the process steps of the prior art up to the point of isolation (that is, the present invention begins with an undoped wafer with a sacrificial oxide). However, instead of proceeding with the formation of the gate stack after isolation, the present invention proceeds with deep well implantation, junction formation, silicidation, local self-aligned well implantation, channel growth, and the formation of the gate stack. By delaying the deposition of the channel material until after the junctions have been formed, many of the processing hurdles associated with producing devices with short gate lengths (<0.25 micron) are avoided. The processing hurdles avoided by the present invention include the concern over impurities entering the channel region during junction formation. Since the present invention preferably does not produce a channel until after the junctions have been formed, the channel region ultimately formed is not affected by impurities introduced by the junction profiles.

Another hurdle the present invention avoids, is undesirable doping profiles in the channel caused by high temperatures. Since the method of the present invention does not produce the channel film until after all the ion implantations and the associated thermal annealing processes have been completed, the channel film is preferably not exposed to the high temperatures of the prior art methods. As a result, undoped materials may be used as the channel film, thereby improving the charge carrier mobility of the channel film.

The present invention also allows gate insulators with large dielectric constants and metallic gate electrodes to be utilized. The present invention avoids the hurdle present in the prior art method of exposing the gate stack to high temperatures and thus requiring the use of highly doped silicon as the gate electrodes. The entire gate stack of the present invention avoids these high temperatures, because the gate stack is preferably not fabricated until after ion implantations have occurred.

Since the entire gate stack and the channel under the present invention do not undergo high temperature processing, the channel can be produced with silicon-based alloys. These silicon-based alloys commonly have narrower band-gaps which result in charge carriers with lower effective masses and higher mobility. As a result, this narrower band-gap allows lower threshold voltages without degrading the sub-threshold characteristics.

Further, the present invention provides a new process step for producing a gate stack in a MOSFET without encountering the obstacles and shortfalls of the prior art process flows. The new process step for producing the gate stack may be suitably used with any process flow, e.g., the new process flow of the present invention or the process flow of the prior art. This new process step preferably provides for the placement of a sacrificial gate structure in the location where the actual gate is to be formed. The sacrificial gate structure is then removed after all implantations have occurred, and the actual channel and gate materials are then deposited.

BRIEF DESCRIPTION OF THE DRAWING FIGURES

FIG. 45 is a series of band-gap diagrams which show the band-gap narrowing and reduced threshold gate voltages which can be realized for an n-channel device under either process flow of the present invention.

DETAILED DESCRIPTION OF PREFERRED EXEMPLARY EMBODIMENTS

The present invention provides a process flow for producing MOSFETs using standard, currently available MOSFET fabrication equipment and techniques. While the present invention is preferably directed towards the production of MOSFETs in the <0.25 micron generation, it is to be appreciated that any size or generation of MOSFET devices may be produced using the methods described herein. The present invention is discussed in the context of a first embodiment and a second embodiment. However, the present invention is not to be limited to the process flows described herein, any process flow or rearrangement of process steps which captures the features of the present invention is considered to be within the scope of the present invention. Additionally, the multiple embodiments of the present invention shall be described herein in conjunction with the formation of twin well structures. However, MOSFETs under process flows described herein may be formed as single well and/or multiple well NMOS and/or PMOS devices without departing from the spirit or scope of the present invention.

In general, in a first embodiment of the present invention, the process flow for fabricating MOSFETs preferably includes the following steps:

1. On a non-doped wafer, isolation zones are inserted;
2. A region of amorphous silicon and high energy implants are used to create a deep well within the area under the layer of amorphous silicon resulting in a crest in the deep well layer below the area in which the gate will later be formed. Additionally, junctions are created on either side of the future channel region;
3. Silicide is grown above the junctions and a sacrificial gate of amorphous silicon;
4. Nitride spacer are formed above the silicide regions;
5. A self-aligned local well is implanted above the crest of the earlier deeply implanted well;
6. Channel material (preferably undoped film) is epitaxially deposited above the well;
7. A gate insulator (preferably a material with a high dielectric) is in-situ deposited;
8. A gate electrode (preferably a barrier metal) is in-situ deposited;
9. A bulk gate electrode (preferably a highly conductive metal) is deposited; and
10. The wafer, via Chemical Mechanical Polishing (CMP), is planarized to the pre-metal dielectric films (i.e., the nitride liner and oxide layer).

Figure 1A:
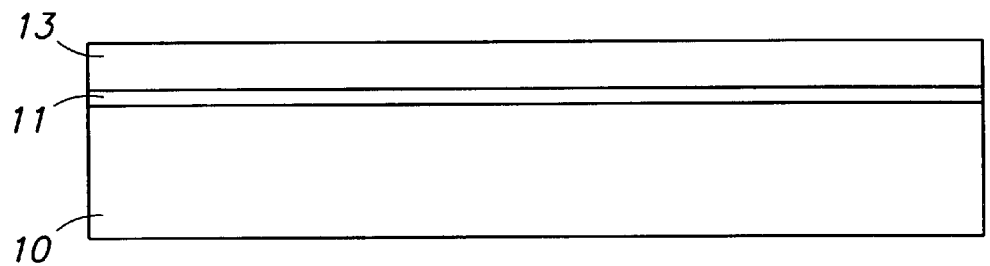
FIG. 1 is a schematic view of a cross-sectional representation of the formation of a semiconductor device using the process flow of the prior art.
Figure 1B:
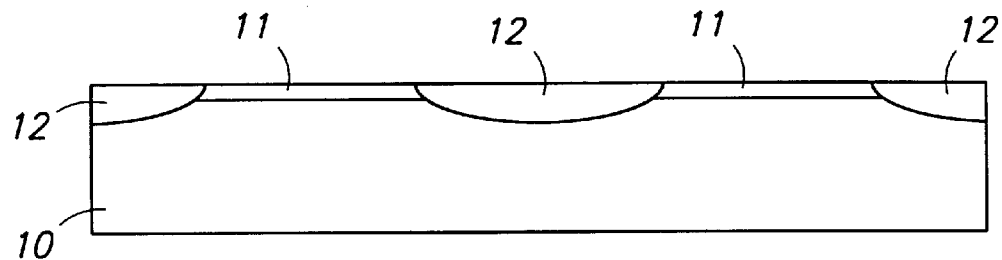
Figure 1C:
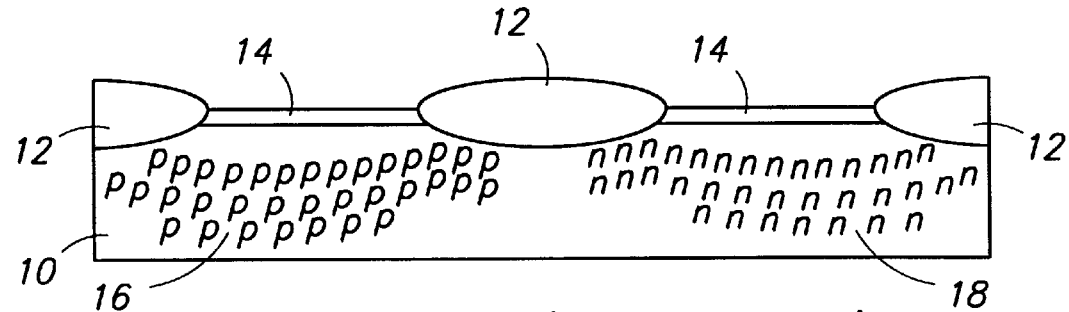
Figure 1D:
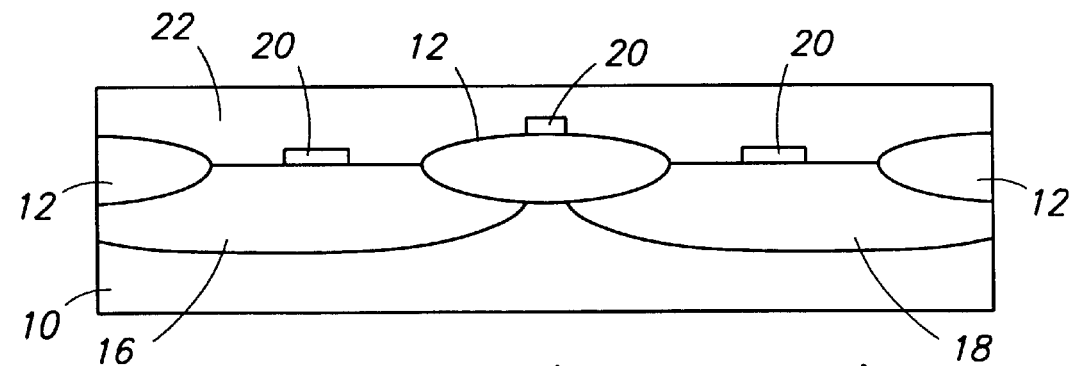
Figure 1E:
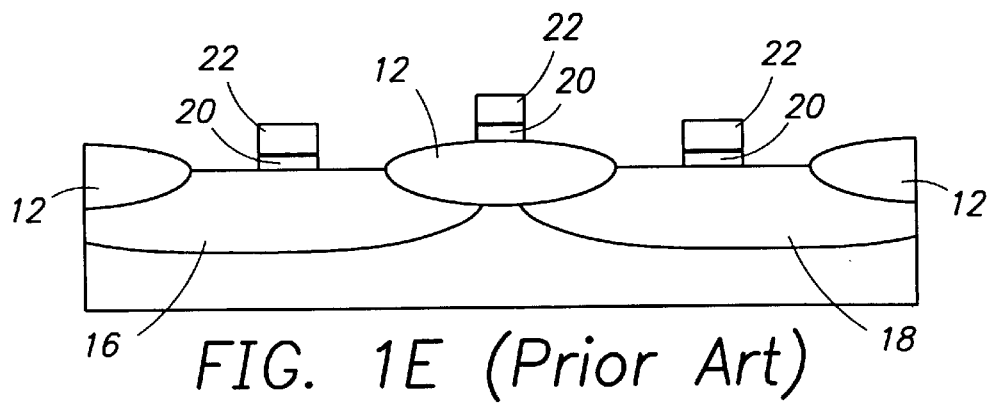
Figure 1F:
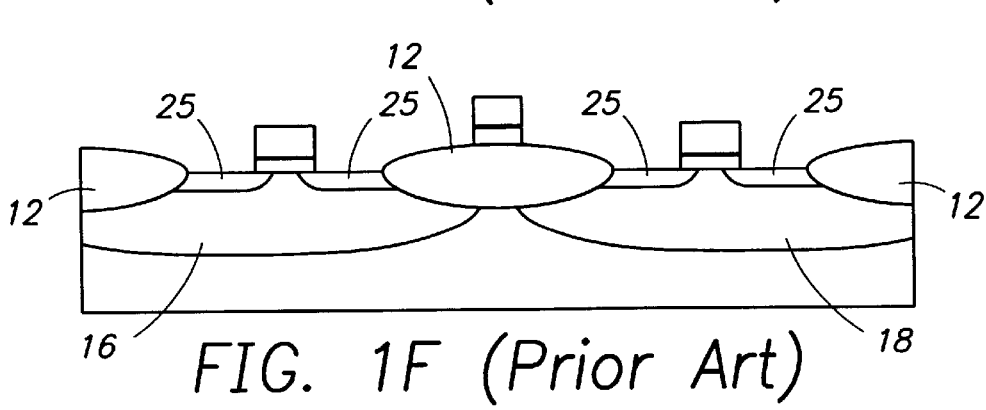
Figure 1G:
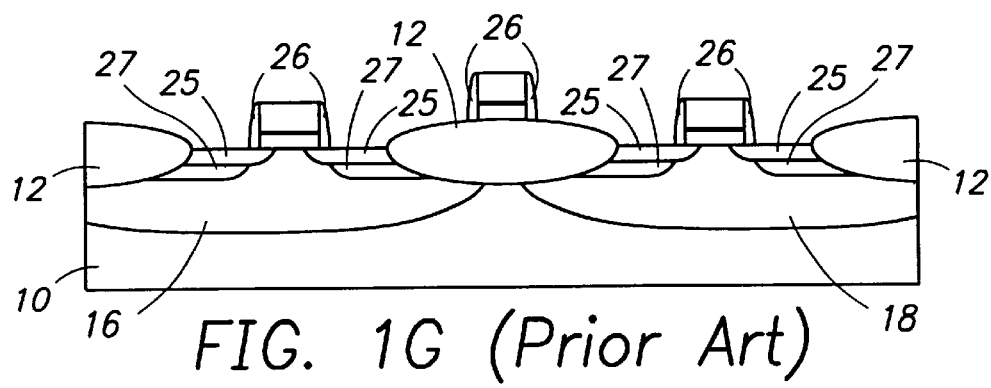
Figure 1H:
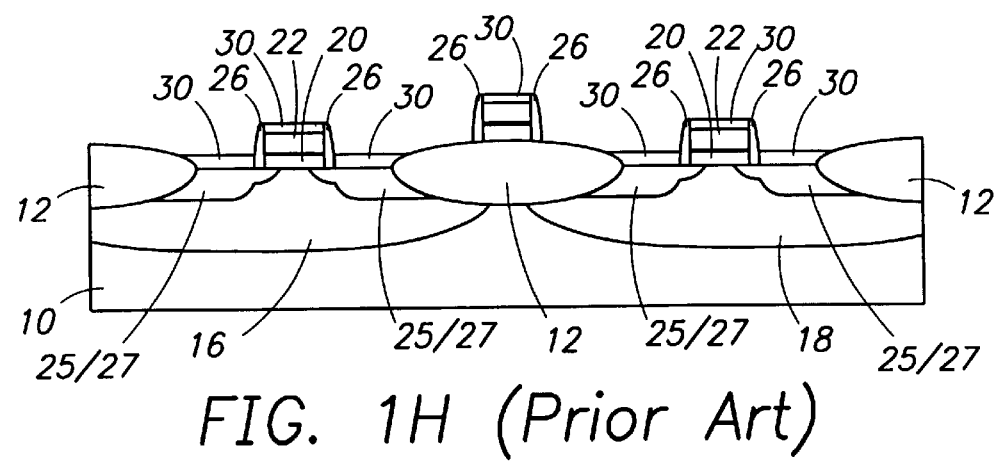
Figure 2A:
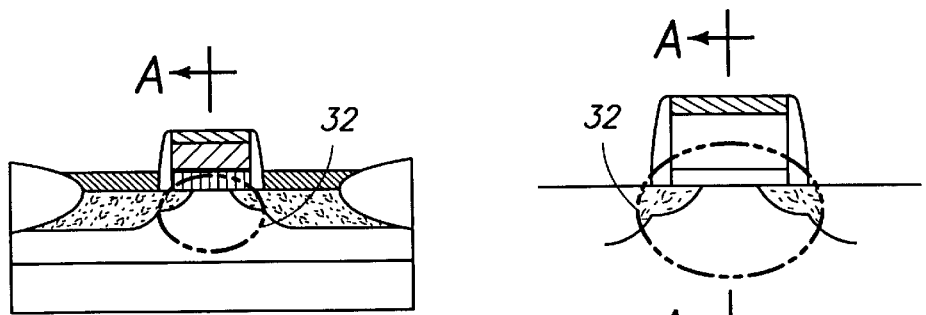
FIG. 2 is a schematic view of a cross-sectional representation of the various junction shapes utilized in the formation of a semiconductor device under the process flow of the prior art.
Figure 2B:
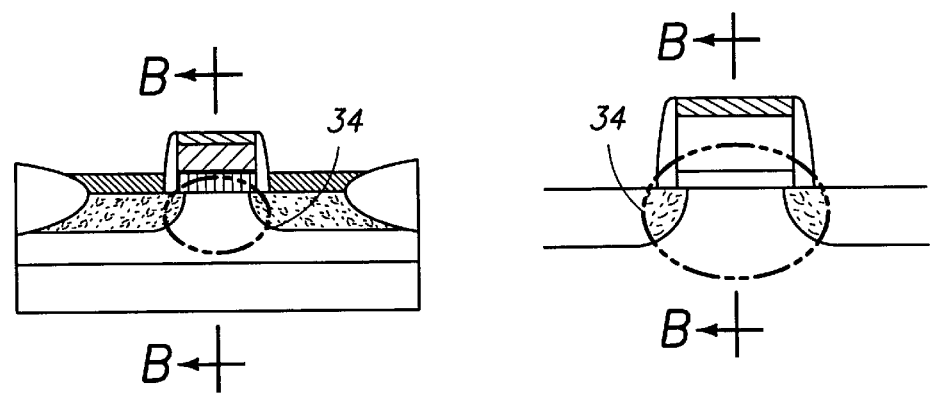
Figure 2C:
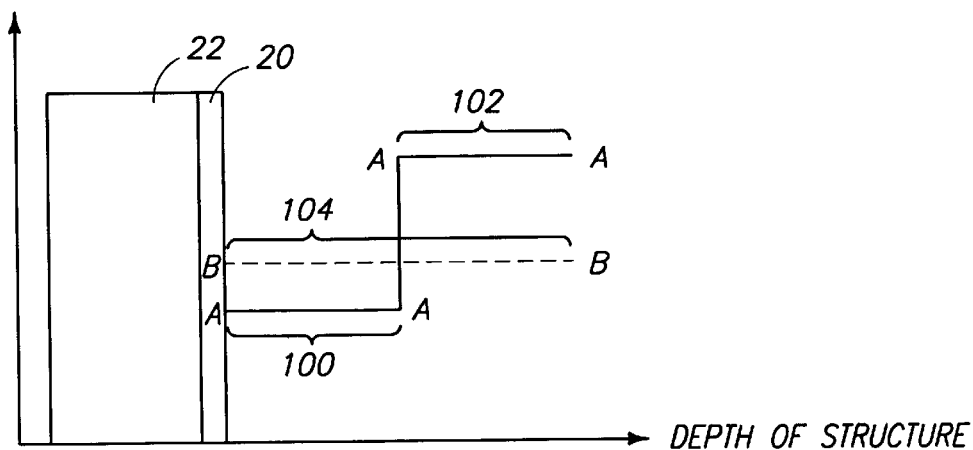
Figure 3:
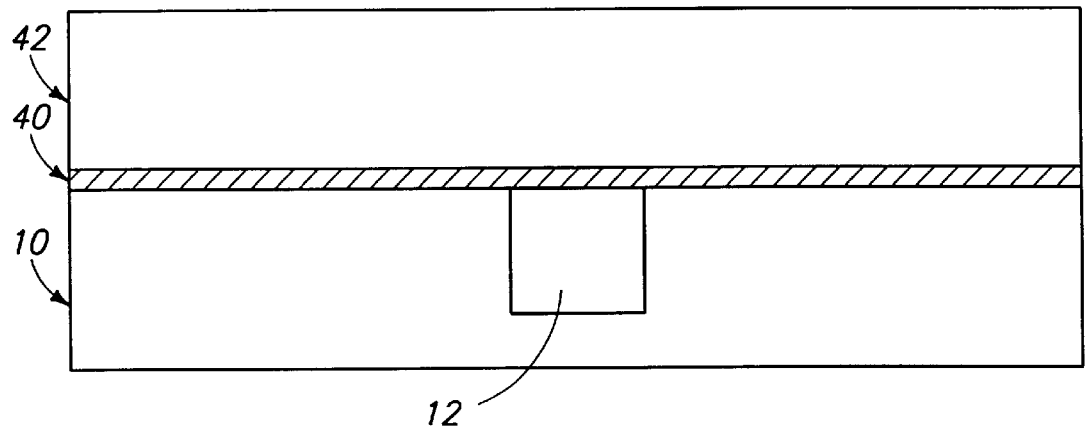
FIG. 3 is a schematic view of a cross-sectional representation of a non-doped silicon wafer into which an isolation region has been inserted and upon which an oxide and an amorphous silicon layer have been deposited under the process flow of the first embodiment of the present invention.

More specifically, the first step preferably begins with the receipt of a non-doped wafer 10 into which an isolation 12 region has been inserted as shown in FIG. 3. The methods of inserting an isolation region into a non-doped silicon or similar (including germanium) wafer is commonly known in the art and therefore is not discussed in detail herein. Any suitable isolation method may be utilized in the process flow of the present invention.

An oxide layer 40 and an Amorphous Silicon (hereafter, "α-Si") layer 42 is preferably deposited upon the non-doped wafer using methods commonly known in the art. Oxide layer 40 is deposited upon the non-doped wafer 10 to a thickness in the range of 3 to 15 nanometers with a preferred thickness of 10 nanometers. However, the present invention is not to be so limited and it is to be appreciated that the Oxide layer 40 may be of any thickness sufficient to provide any desired effects, including insulation, separation, and providing the base elements necessary for the growth or formation of various layers and/or structures which comprise a MOSFET.

Figure 4:
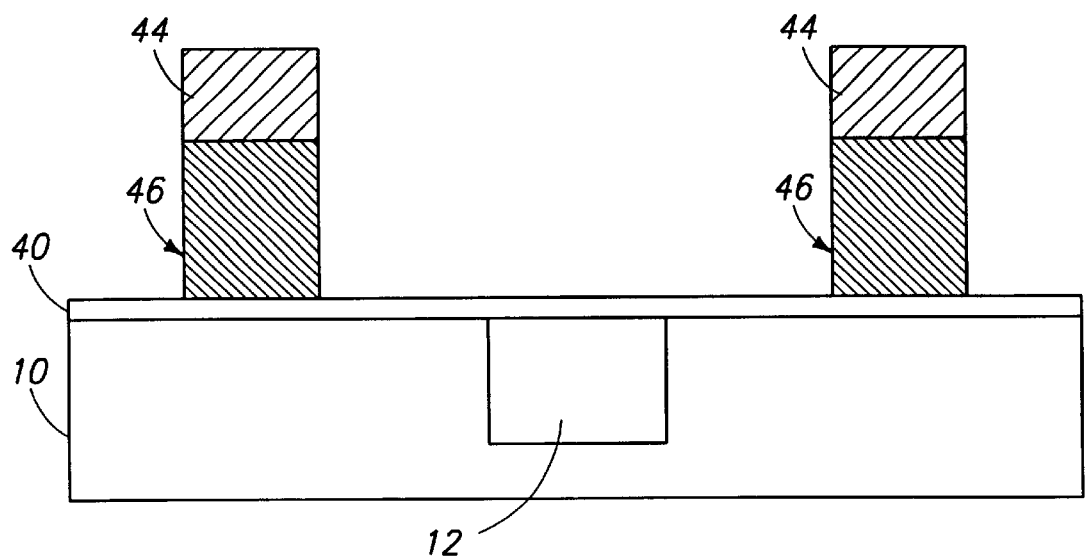
FIG. 4 is a schematic view of a cross-sectional representation of the wafer of FIG. 3 after the patterning of the amorphous silicon has occurred under the process flow of the first embodiment of the present invention.

The second step of the first embodiment preferably provides for the formation of sacrificial gates 46 above the region in which the actual gates are later to be formed. This step uses standard process techniques for depositing compounds, patterning structures, and selectively etching the deposited compounds. In this embodiment, α-Si is preferably used as the sacrificial compound. However, it is to be understood that any compound which provides the desired characteristics (i.e., physical separation, non-interaction with various compounds and processes) is within the scope of the present invention. The α-Si layer 42 is preferably deposited and etched such that sacrificial gates 46 are formed above the actual gate regions as shown in FIG. 4.

One skilled in the art will realize, that the width of the photo resist mask 44 positioned above the α-Si layer 42 will eventually determine the gate length. Therefore, the dimensions of the photo resist mask 44 are critical in providing a future region wherein the actual gate structure may be formed under the process flow of this embodiment of the present invention. Since the creation, formation, and positioning of photo resist masks is commonly known, they are not discussed further herein. After sacrificial gates 46 of the desired dimensions are suitably formed, the photo resist mask 44 is preferably removed and the structure is suitably cleaned.

The third step of the process flow of the first embodiment of the present invention preferably provides for the implantation of the deep wells followed by the implantation of the junctions for a first device structure (an NMOS or a PMOS), and then the implantation of the deep wells and junctions for the opposite device structure (a PMOS or an NMOS, respectively). Preferably the deep wells are self-aligned with the sources and drains using commonly known processes.

Figure 5:
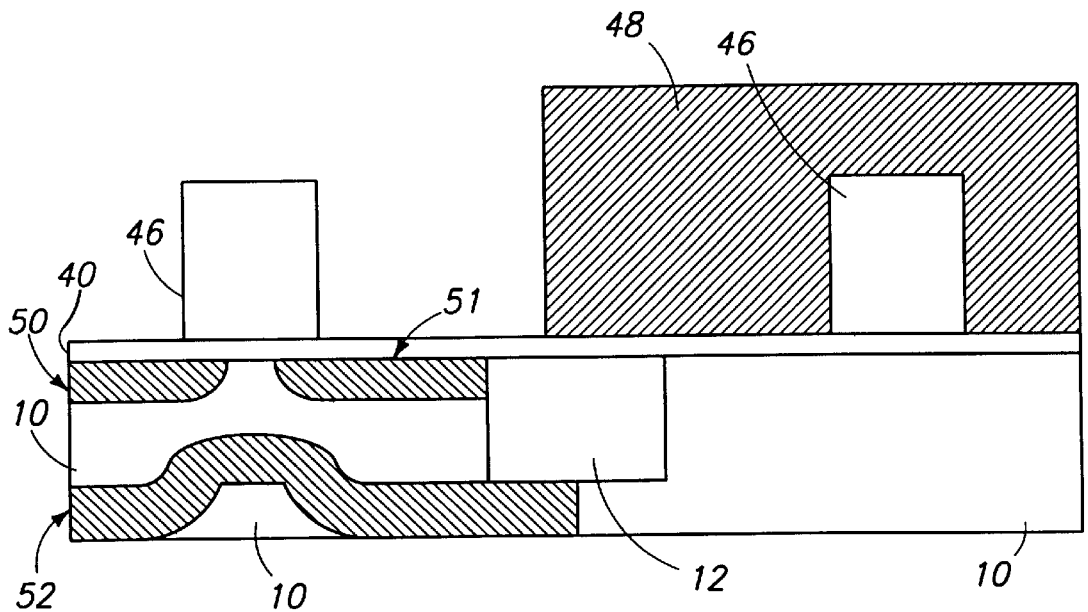
FIG. 5 is a schematic view of a cross-sectional representation of the wafer of FIG. 4 after the deep well and junctions for an NMOS have been implanted into the substrate under the process flow of the first embodiment of the present invention.

As shown in FIG. 5, before an NMOS is implanted, preferably a photo resist mask 48 is suitably positioned above those regions of the non-doped wafer in which a PMOS structure is to be formed. For the purpose of this description only, the right side of the structure is to be a PMOS while the left side is an NMOS. However, it is to be understood that either side may be suitably configured as a PMOS or an NMOS.

Next, a p-doped deep well 52 is preferably formed by high energy ion implantation using known techniques. Since no other do pants have been implanted into the device structure at this point in the process flow, the well may be suitably driven in and formed without concern for the contamination of other structures. Following well formation, n+ doped source and drain junctions 50 are implanted using known techniques.

Figure 6:
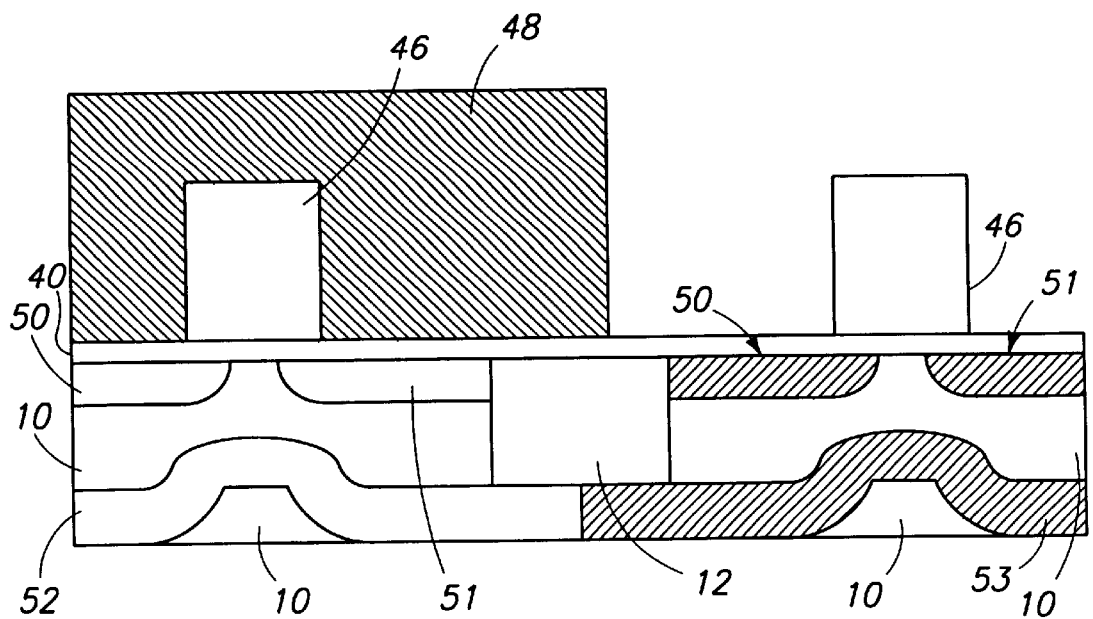
FIG. 6 is a schematic view of a cross-sectional representation of the wafer of FIG. 5 after the deep well and junctions for a PMOS have been implanted into the substrate under the process flow of the first embodiment of the present invention.

Following the formation of the p-doped deep well 52 and the n+ doped junctions 50 for an NMOS device, the photo resist mask is suitably repositioned over the NMOS region, as shown in FIG. 6, and a PMOS device is formed by using known implantation techniques, resulting in an n-doped deep well 53 and p+ doped junctions 51.

Since the process flow of the present invention is preferably to be utilized for devices with a very low operating voltage, HCE is not a concern. The junctions may be steep instead of shallow and may be suitably implanted in one process step. Thus, the present invention eliminates the need to first form a shallow junction followed by a deeper junction, and thus simplifies the process flow for junction formation. However, the present invention is not to be construed as being limited to producing only <0.25 micron generation devices wherein steep junctions are preferred. In fact any form or size of junctions, whether shallow or steep, may be suitably formed using known methods without departing from the spirit or scope of the present invention.

Following the implanting of the deep wells 52 and 53 and the junctions 50 and 51, the device is preferably subjected to Rapid Thermal Processing (RTP), or similar processing techniques, to anneal the implants. Since the channel has not yet been formed, the process flow of the present invention eliminates many of the thermal budget constraints of the prior methods, and allows for the junctions to be firmly set and full annealing accomplished. However, the process flow of the present invention also permits thermal processing to be postponed until later in the process flow. The thermal annealing can be delayed until after the local well has been implanted, but before the gate stack has been formed, without reducing any of the advantages of the process flow or departing from the spirit or the scope of the present invention.

Figure 7:
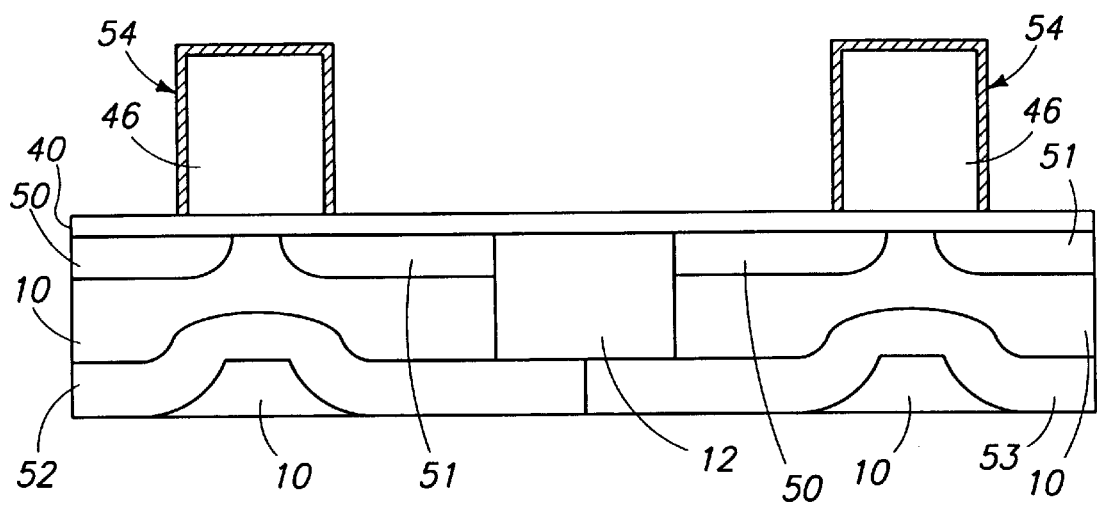
FIG. 7 is a schematic view of a cross-sectional representation of the wafer of FIG. 6 after the oxidation of the amorphous silicon sacrificial gate stacks has occurred under the process flow of the first embodiment of the present invention.
Figure 8:
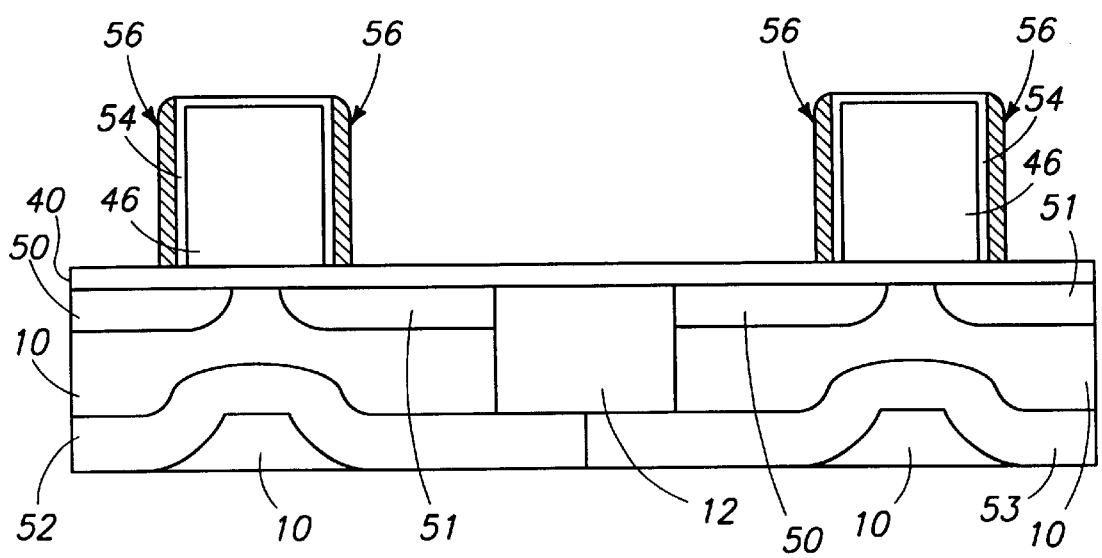
FIG. 8 is a schematic view of a cross-sectional representation of the wafer of FIG. 7 after the deposition and etchback of nitride spacers has occurred under the process flow of the first embodiment of the present invention.
Figure 9:
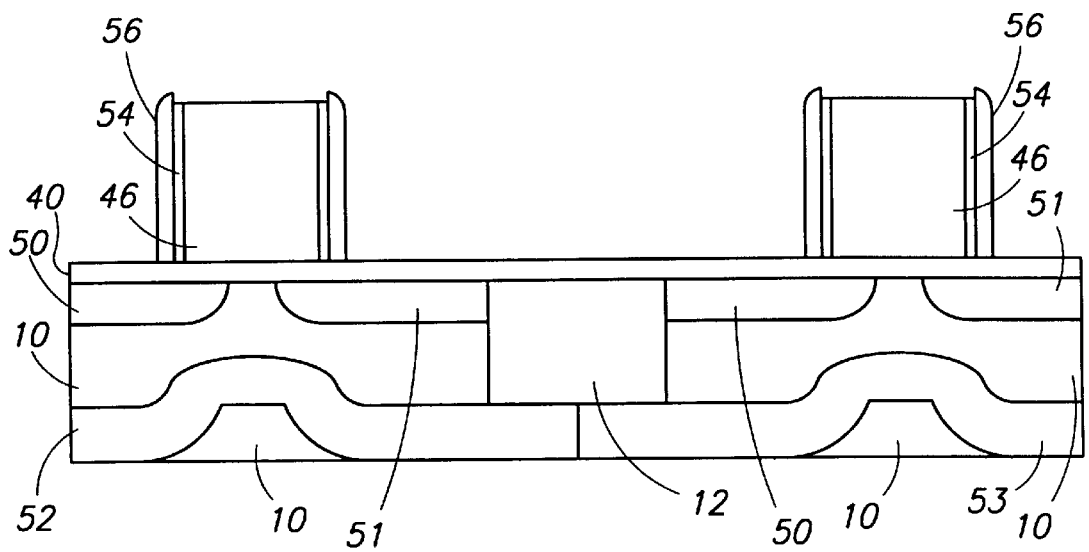
FIG. 9 is a schematic view of a cross-sectional representation of the wafer of FIG. 8 after the cleaning and etching of the sacrificial oxide layer has occurred under the process flow of the first embodiment of the present invention.

The fourth step preferably provides the process steps necessary for the eventual formation of a self-aligned silicide on the source and drain junctions 50 and 51. These process steps preferably include: (1) the formation of an oxidation layer 54 upon the sacrificial gates 46 (as shown in FIG. 7); (2) the Chemical Vapor Deposition (CVD) of nitride $Si_3N_4$ 56 upon the oxide layer 54 (as shown in FIG. 8); and (3) the etchback of the nitride 56, oxide 54, and the sacrificial oxide 40 (as is shown in FIG. 9). While these steps are described as a series of individual process steps, it is to be understood that any order or arrangement of process steps or the use of any compounds which provide a method of isolating the region in which the gate stack will be formed from the junction regions, while providing an underlying device structure suitable for the formation of self-aligned silicide in the region of the junctions 50 and 51 and the sacrificial gate 46, is to be considered as being within the scope of the present invention. Additionally, the nitride region 56 is preferably formed so as to provide an electrical isolation layer between any silicide deposited on top of the sacrificial gate 46 and the junctions 50 and 51.

Figure 10:
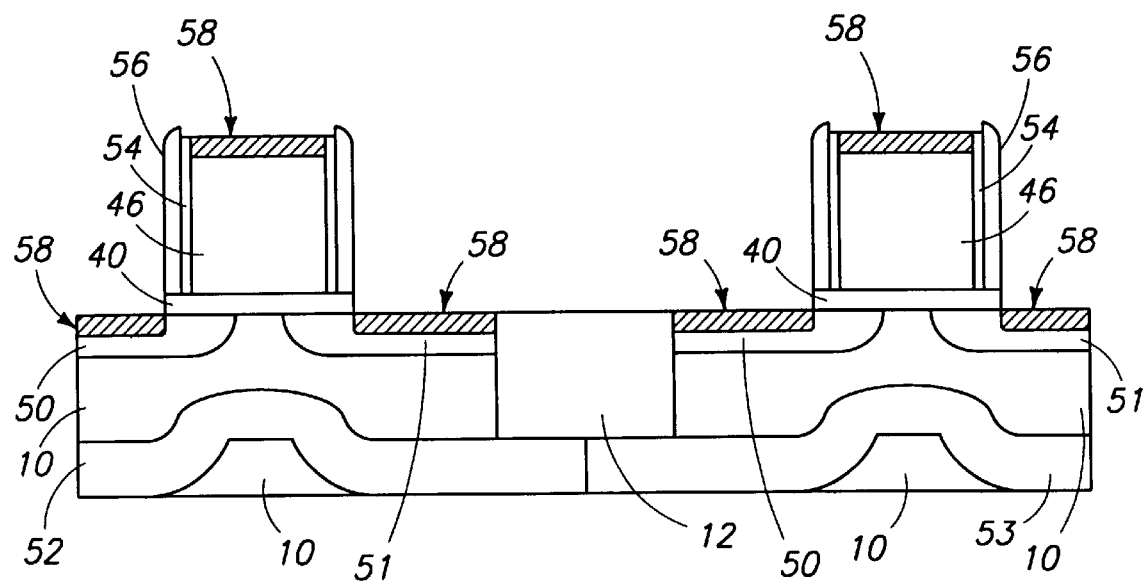
FIG. 10 is a schematic view of a cross-sectional representation of the wafer of FIG. 9 after the formation of silicide has occurred under the process flow of the first embodiment of the present invention.

The fifth step preferably provides for the formation of self-aligned suicides 58 in the junctions 50 and 51 and/or in the sacrificial gate 46 using known techniques (as shown in FIG. 10).

Figure 11:
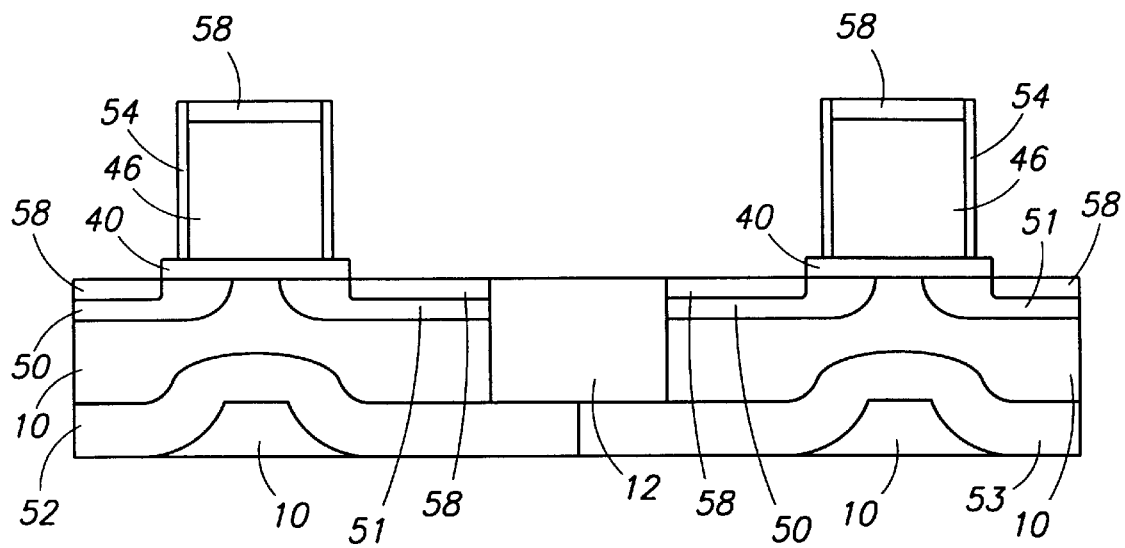
FIG. 11 is a schematic view of a cross-sectional representation of the wafer of FIG. 10 after the selective etching of the nitride spacers has occurred under the process flow of the first embodiment of the present invention.
Figure 12:
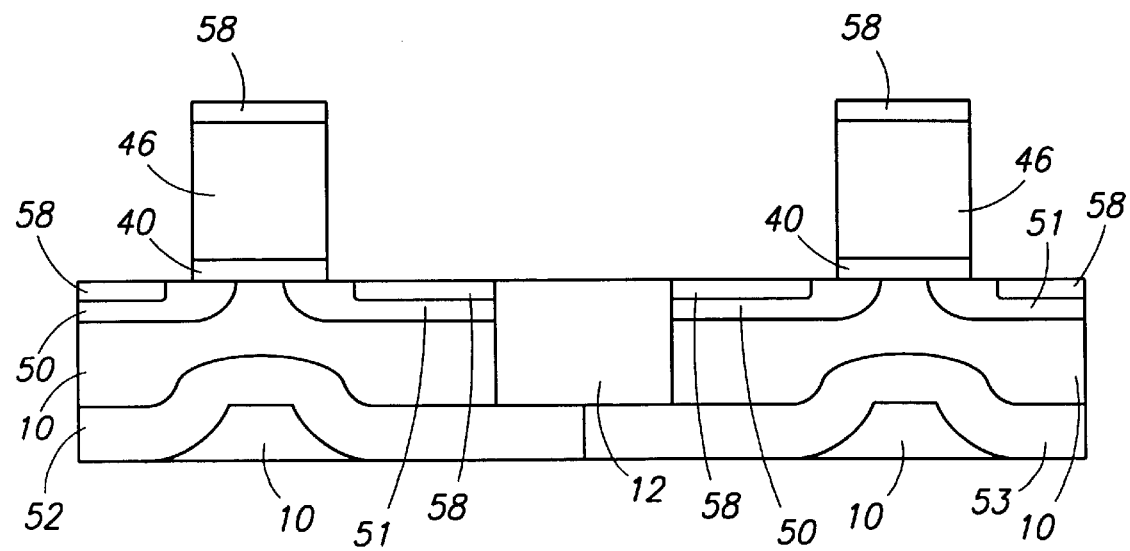
FIG. 12 is a schematic view of a cross-sectional representation of the wafer of FIG. 11 after the selective etching of the oxide layers has occurred under the process flow of the first embodiment of the present invention.
Figure 13:
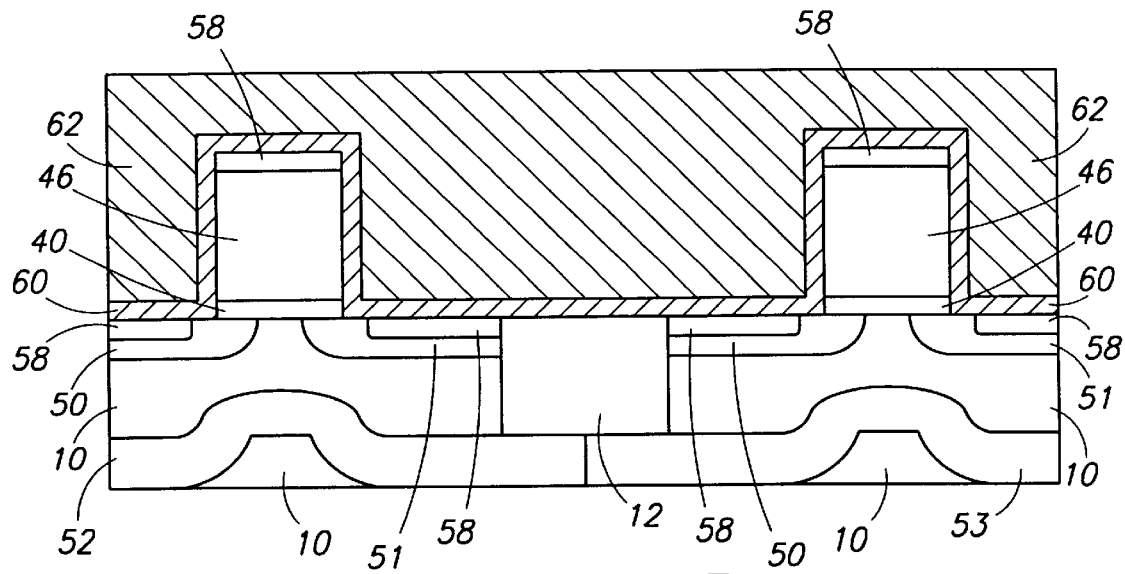
FIG. 13 is a schematic view of a cross-sectional representation of the wafer of FIG. 12 after the deposition of a nitride liner and an oxide has occurred under the process flow of the first embodiment of the present invention.
Figure 14:
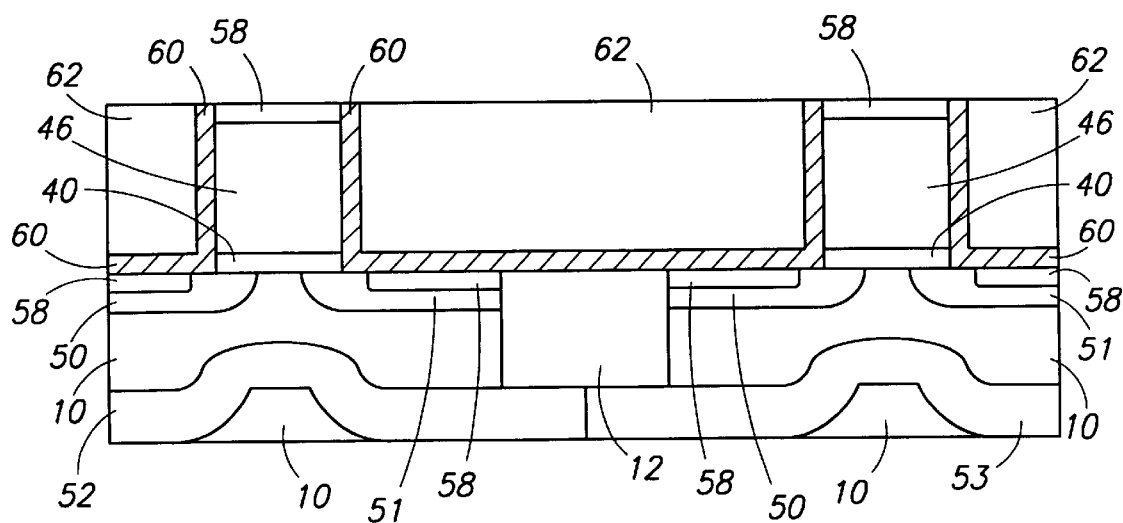
FIG. 14 is a schematic view of a cross-sectional representation of the wafer of FIG. 13 after the planarization of the oxide and nitride layers has occurred under the process flow of the first embodiment of the present invention.
Figure 15:
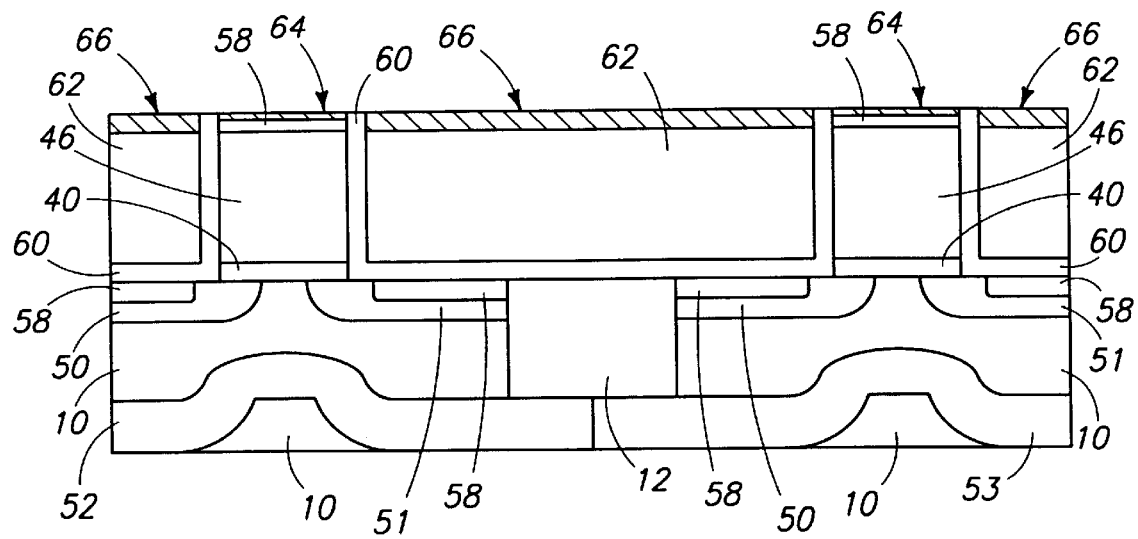
FIG. 15 is a schematic view of a cross-sectional representation of the wafer of FIG. 14 after nitrogenation has occurred under the process flow of the first embodiment of the present invention.
Figure 16:
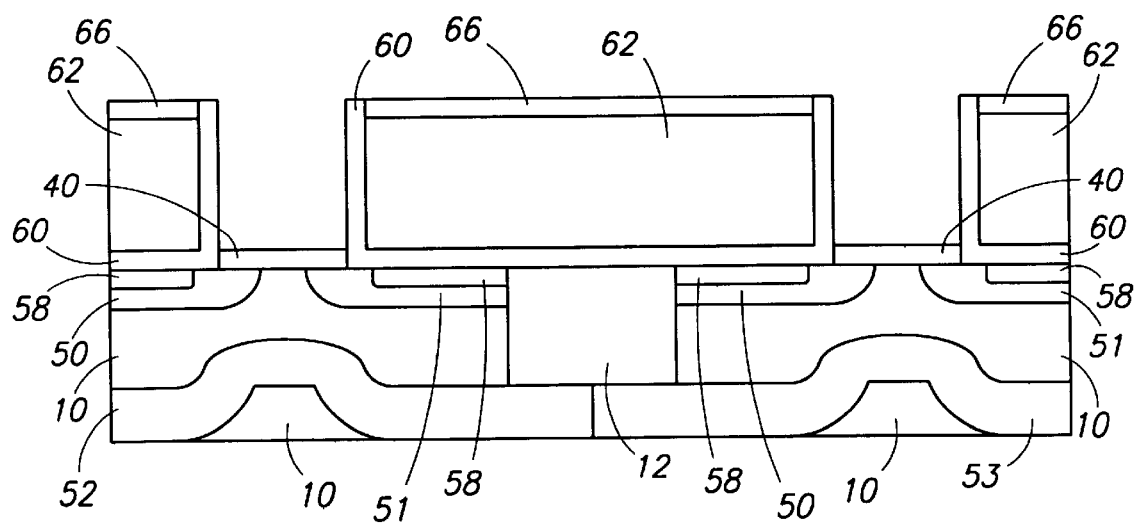
FIG. 16 is a schematic view of a cross-sectional representation of the wafer of FIG. 15 after selective etching of the sacrificial gate structure has occurred under the process flow of the first embodiment of the present invention.

The sixth step of this embodiment of the present invention preferably provides those process steps necessary to prepare the device for the formation of the self-aligned wells. These process steps preferably include: (1) selective etching of the nitride 56 against the oxide 54 and silicide 58 (as shown in FIG. 11); (2) selective etching of the oxide 54 against the sacrificial gate 46 and the silicide 58 (as shown in FIG. 12); (3) CVD of a nitride liner 60 and an oxide 62 trench fill (as shown in FIG. 13); (4) planarization and CMP of oxide and nitride 60 stopping on the sacrificial gate. 46 (as shown in FIG. 14); (5) nitrogenation (which is preferably accomplished by RTP in $NH_3$), which preferably results in the formation of a nitride 66 (or an oxinitride) on the oxide 62 and the formation of TiN 64 on silicide 58 (as shown in FIG. 15); and (6) selectively etching TiN 64 (for example, with 100% $H_2O_2$), silicide 58, and the sacrificial gate 46, thereby selectively removing the sacrificial gate 46 while preferably not affecting the pre-metal dielectric regions which have been formed above the junctions 50 and 51 (as shown in FIG. 16). While these steps are described as encompassing a series of individual process steps, it is to be understood that any order or arrangement of process steps which provides a method of isolating the region in which the gate stack will be formed from the junction regions, while providing an underlying device structure suitable for the formation of contacts with the silicide regions above the junction regions, is considered to be within the scope of the present invention. In this respect, the "numbering" of the above steps is merely used to assist in the description of the process and is not intended to limit the process in any way.

Figure 17:
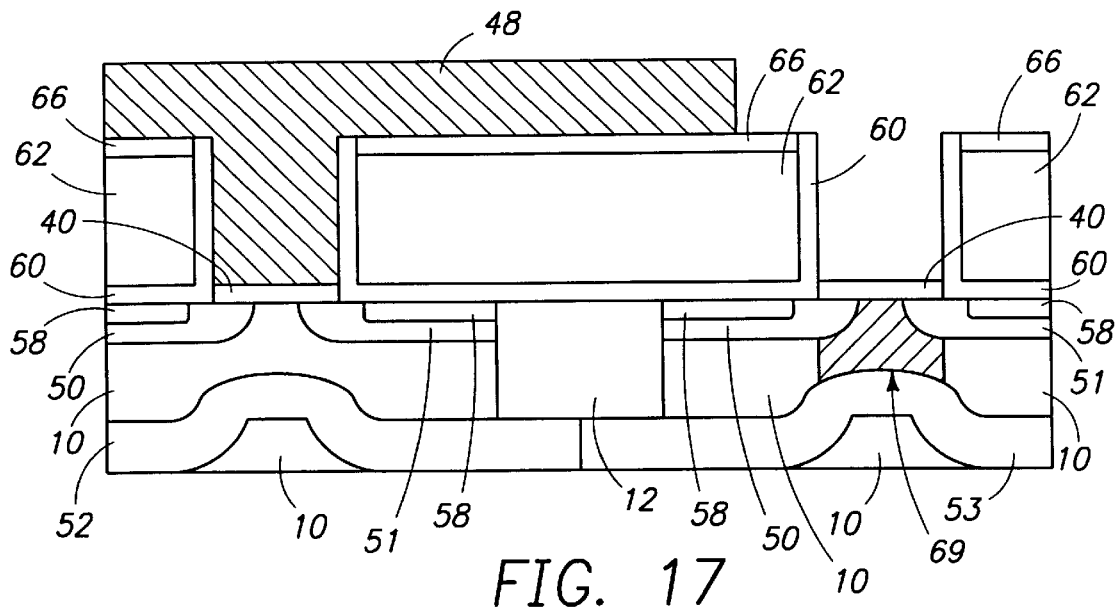
FIG. 17 is a schematic view of a cross-sectional representation of the wafer of FIG. 16 after the implantation of a PMOS local well has occurred under the process flow of the first embodiment of the present invention.
Figure 18:
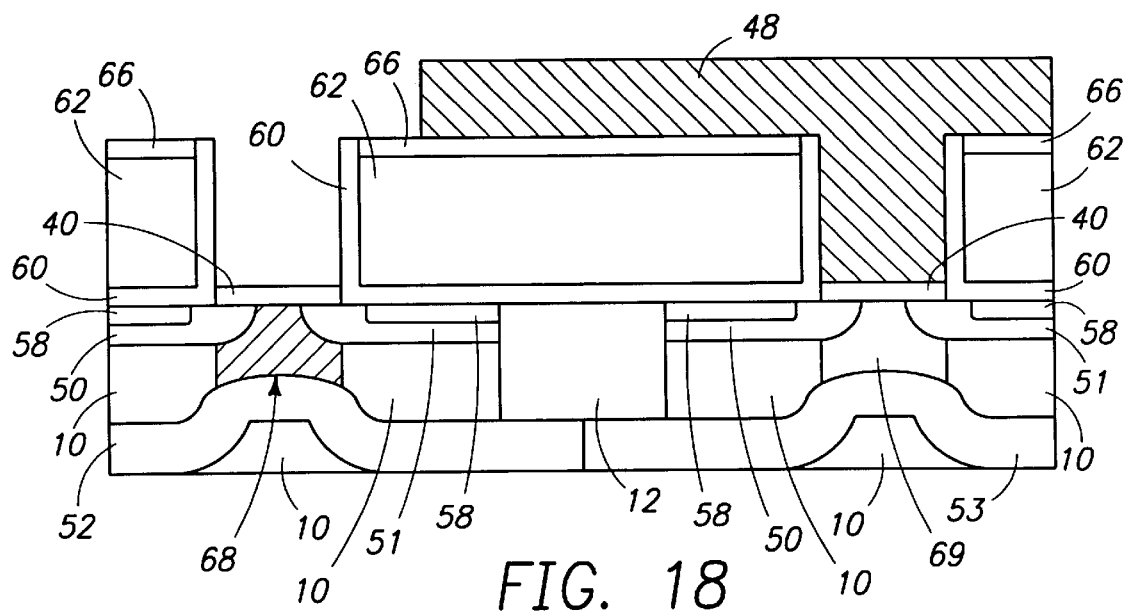
FIG. 18 is a schematic view of a cross-sectional representation of the wafer of FIG. 17 after the implantation of an NMOS local well has occurred under the process flow of the first embodiment of the present invention.

The seventh step of this embodiment of the present invention preferably provides for the photo resist masking off of those regions within which an alternative device structure is to be formed. As shown in FIG. 17, the region within which an NMOS is to be formed is masked off while the PMOS region is exposed to ion implantations which preferably form a self-aligned n-doped local well 69. Similarly, as shown in FIG. 18, the region within which a PMOS is to be formed is masked off while the NMOS region is exposed to ion implantations which preferably form a self-aligned p-doped local well 68. It is to be appreciated that while this embodiment describes the masking off of the NMOS region followed by the masking off of the PMOS region, the present invention is not to be so limited. Either region, NMOS or PMOS, may be formed prior to the formation of the other region. Additionally, an NMOS or PMOS region may be separately formed regardless of whether a counterpart PMOS or NMOS region is formed.

Figure 19:
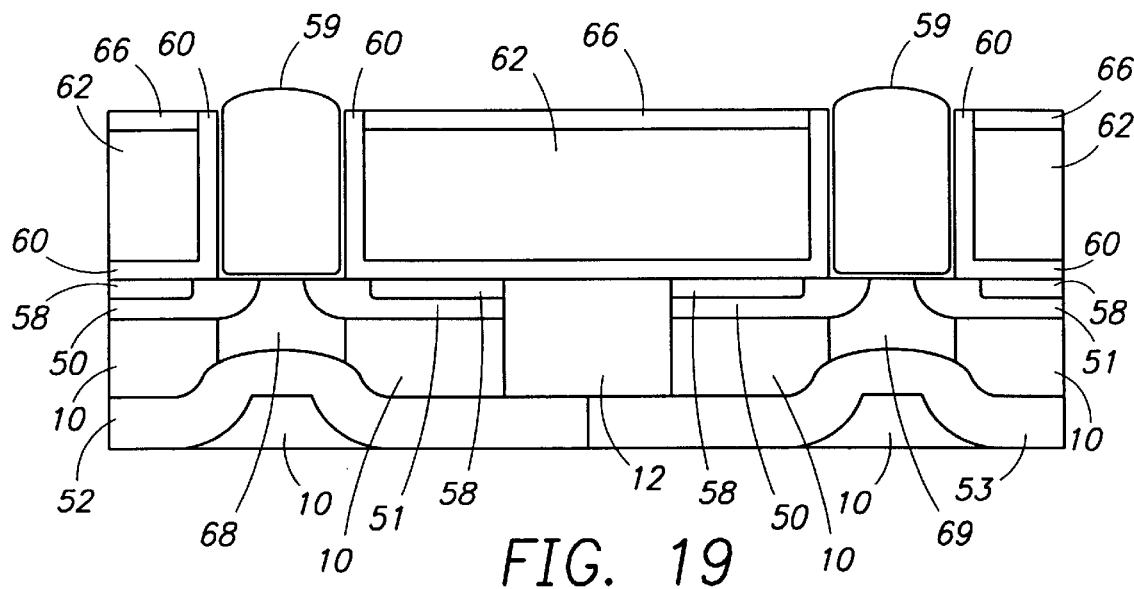
FIG. 19 is a schematic view of a cross-sectional representation of the wafer of FIG. 18 after a pre-gate epitaxial cleaning of the device has occurred under the process flow of the first embodiment of the present invention.

After implanting the local wells 68 and 69, the gate regions 59 are cleaned and the oxide layer 40 in the gate regions 59 is suitably removed (as shown in FIG. 19). The device is then preferably baked at a sufficient temperature to ensure the structures formed up to this point are fixed in the wafer structure. RTP or similar device baking techniques known in the art may be utilized to ensure the well and junction regions are electrically activated and any defects are annealed. Additionally, these baking processes are preferably performed using known techniques to ensure the surface is suitable for epitaxial deposition of the channel film.

Figure 20:
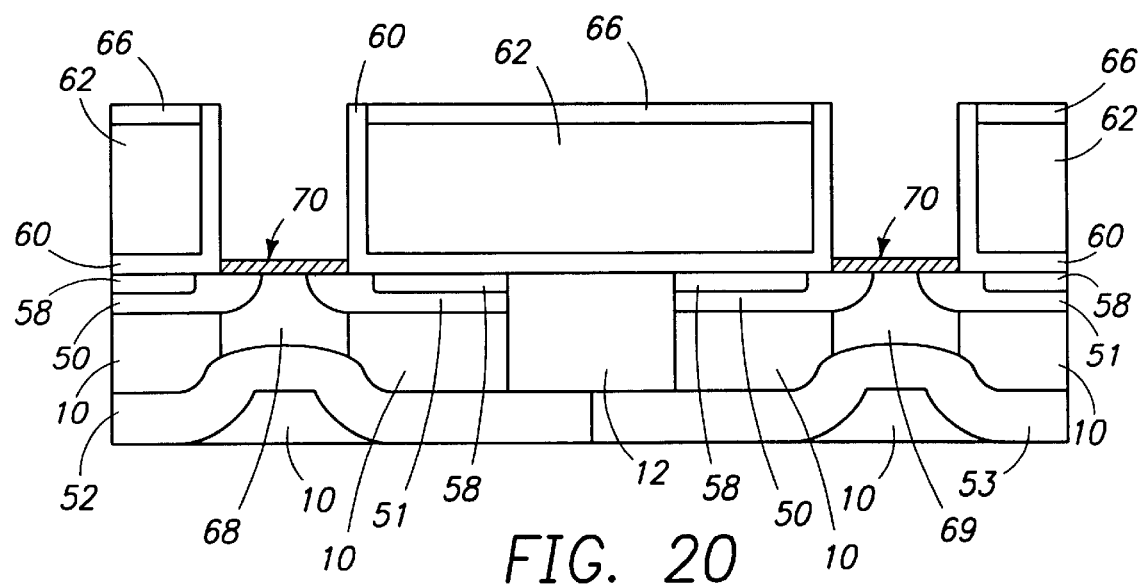
FIG. 20 is a schematic view of a cross-sectional representation of the wafer of FIG. 19 after the deposition of the channel material has occurred under the process flow of the first embodiment of the present invention.

The eighth step of this embodiment of the present invention preferably provides for the deposition of the channel material 70 (as shown in FIG. 20). Preferably the deposition is performed epitaxially and is selectively applied; the channel material selected is an undoped film which provides for maximum electron and hole mobility. Since the process flow of the present invention preferably does not expose the channel materials to the high temperatures commonly utilized in forming the well and junction structures, the channel material may preferably be a silicon based alloy with a narrower band-gap and lower effective masses (electron and hole). However, the present invention is not to be construed as being limited to only silicon based alloys, any material which can be deposited pseudo-morphically on silicon is considered to be within the scope of the present invention.

Figure 21:
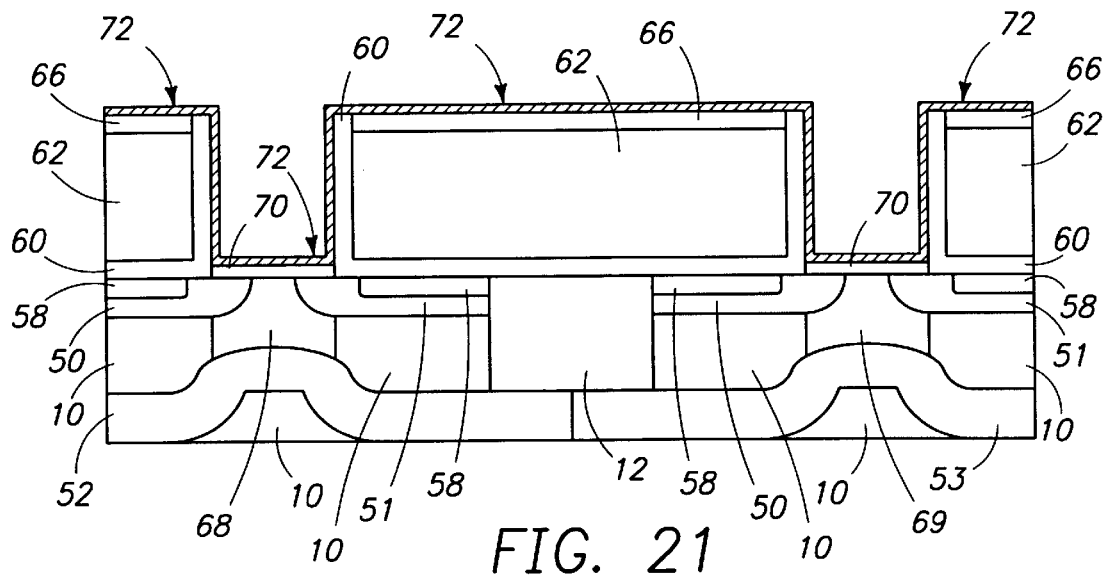
FIG. 21 is a schematic view of a cross-sectional representation of the wafer of FIG. 20 after the deposition of a gate insulator has occurred under the process flow of the first embodiment of the present invention.

The ninth step of this embodiment of the present invention preferably provides for the formation of the gate stack. The formation of the gate stack preferably begins with the in-situ deposition of a gate insulator 72 above the channel 70 (as shown in FIG. 21). Preferably the gate insulator is such that a very large capacitance is obtained. Metal oxides, including compounds such as $Ta_2O_5$ or $TiO_2$ (both of which may be suitably deposited via CVD), which preferably provide a larger capacitance than silicon dioxide ($SiO_2$), may be utilized in the present invention as the gate insulator because the process of the present invention generally does not expose the gate insulator to high temperatures. Thus, concerns with the vaporization or deformation of the gate insulator during RTP or similar processes are eliminated, thereby allowing a higher gate capacitance to be obtained. However, the present invention is not limited to the use of a metallic oxide as the gate insulator, any compound (including silicon dioxides, silicon nitrides, or the like) which provides the desired capacitance and insulation (both physical and electrical) may be utilized.

After the deposition of the gate insulator, the formation of the gate stack preferably continues with the in-situ deposition of the gate electrode. The deposition of the gate electrode may constitute multiple layers wherein more conductive metals are subsequently deposited upon previously deposited layers. Depending upon the gate insulator chosen, the conductivity of the gate electrode material chosen, and the electrical insulation desired (in part a determination of the power levels utilized, and other factors known in the art) any number of gate electrode layers may be utilized without departing from the spirit or scope of the present invention.

Figure 22:
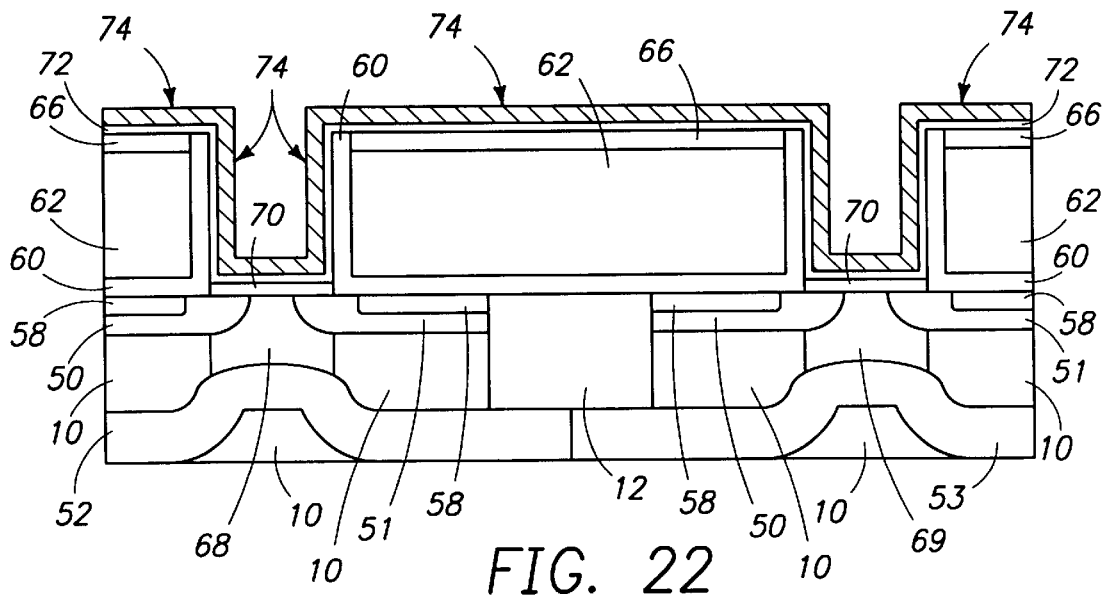
FIG. 22 is a schematic view of a cross-sectional representation of the wafer of FIG. 21 after the deposition of a gate electrode has occurred under the process flow of the first embodiment of the present invention.

In this embodiment of the present invention, a two layer gate electrode is preferably utilized. As shown in FIG. 22, a first layer 74 of the gate electrode may preferably be a barrier metal such as TiN or TaSiN which may be suitably deposited upon the gate insulator by CVD.

Figure 23:
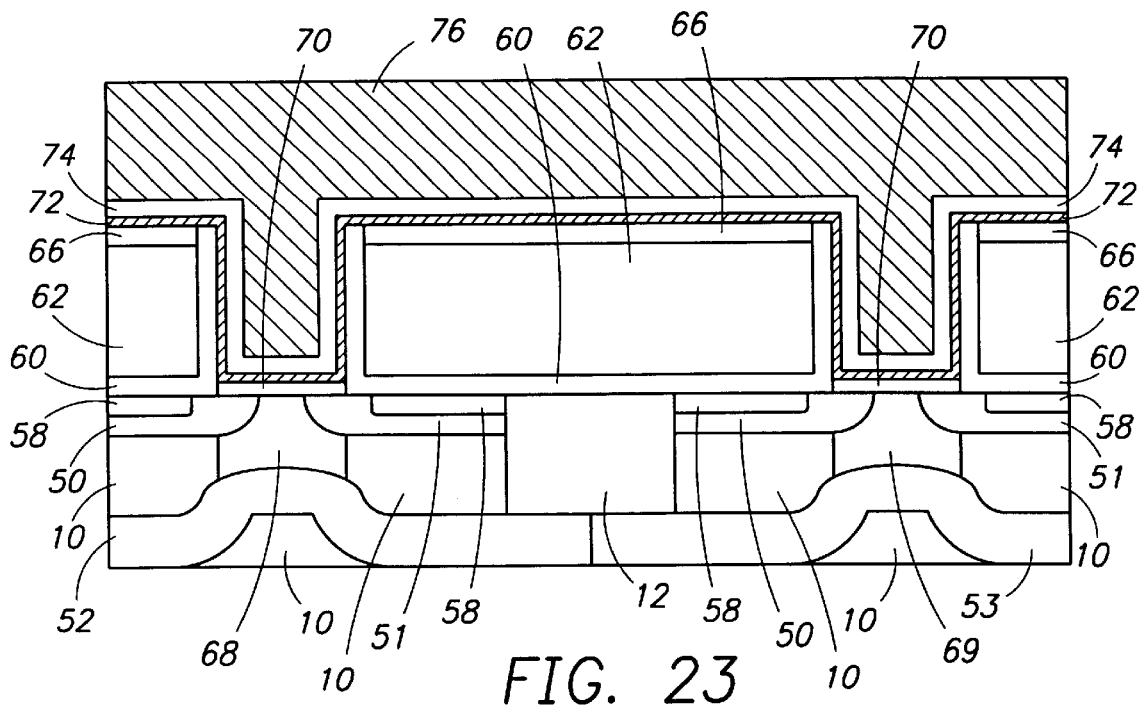
FIG. 23 is a schematic view of a cross-sectional representation of the wafer of FIG. 22 after the deposition of a second gate electrode has occurred under the process flow of the first embodiment of the present invention.

The gate electrode deposition is then preferably followed by the deposition of a second layer gate electrode 76 (as shown in FIG. 23). The second layer gate electrode 76 may be any material which provides the desired electrical conductivity including poly-silicon compounds. Preferably the gate electrode 76 is composed of a highly conductive metal such as tungsten, copper, or the like. By providing for the formation of the gate stack after the implantation and RTP of the wells and junctions, the present invention allows for pure metals to be utilized without concern as to whether subsequent processes will diffuse, evaporate, or destroy the metal compounds.

Figure 24:
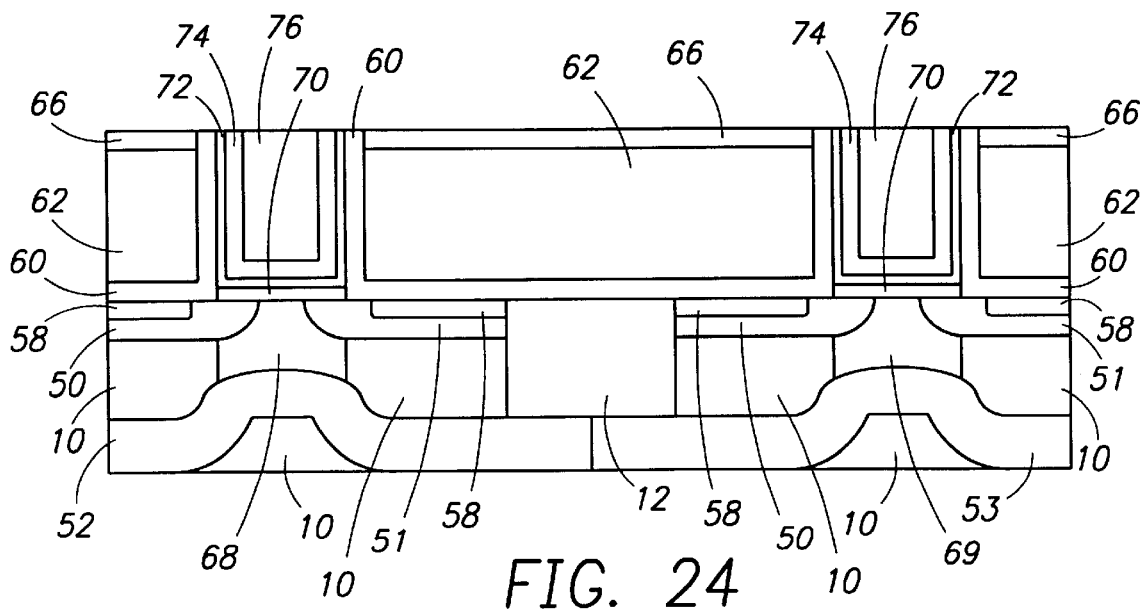
FIG. 24 is a schematic view of a cross-sectional representation of the wafer of FIG. 23 after planarization of the device structure has occurred under the process flow of the first embodiment of the present invention.

The final process step of this embodiment of the present invention provides for planarization and thinning the device structure until the nitride layer 66 is reached (as shown in FIG. 24). Preferably, the planarization and thinning of the device is accomplished via CMP, however, any method of planarizing and reducing the device structure is within the scope of the present invention. This final step preferably removes the excess gate stack layers previously deposited on the device during the formation of the gate stack. At this point the device is ready for back-end processing using existing and known techniques.

In a second embodiment of the present invention, MOSFET with a short active area, including contacts to the source and the drain made over the isolation regions, is provided. Additionally, this embodiment preferably retains the several features and characteristics of the new process flow, namely the formation of the channel and gate stack after the wells and junctions have been formed. As a general overview, the second embodiment of the present invention preferably includes the following process steps:

1. On a non-doped wafer, isolation zones are inserted;
2. A junction is implanted between the isolation zones;
3. Silicide is applied across the top of the junctions and isolation zones;
4. The silicide is selectively etched;
5. A sacrificial oxide layer and an amorphous silicon layer are deposited;
6. Gates are patterned by selectively etching a layer of amorphous silicon previously deposited above the sacrificial oxide layer;
7. The oxide layer is selectively etched except for those areas under the amorphous silicon layer (i.e., the region where the gate stack will be formed);
8. A nitride layer is deposited upon the surface areas followed by an oxide layer to fill in any trenches;
9. CMP is applied to the oxide layer until the top region of the amorphous silicon is reached at which time the amorphous silicon is selectively etched;
10. A self-aligned well is then implanted through the region from which the amorphous silicon was previously removed;

11. The sacrificial oxide above the gate region is removed and the channel material (preferably an undoped film) is epitaxially grown;
12. A gate insulator and gate electrode are deposited on the surface;
13. A bulk metal gate electrode is deposited on all surface areas;
14. CMP is applied to the structure and all layers are removed until the oxide layer is reached; and
15. Contact holes are formed.

Figure 25:
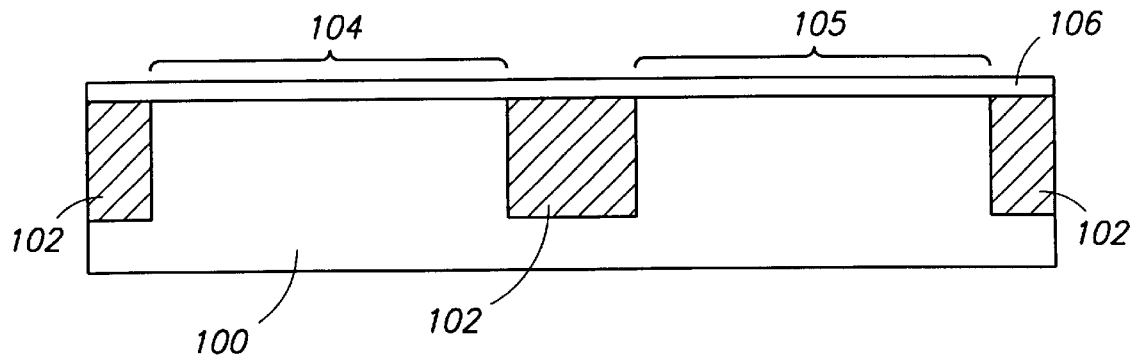
FIG. 25 is a schematic view of a cross-sectional representation of a non-doped silicon wafer into which isolation regions have been inserted and upon which an oxide layer has been deposited.

More specifically, the first step of this second embodiment preferably begins with a non-doped wafer 100 within which isolation zones 102 have been formed such that short "active" areas 104 and 105 arise, as shown in FIG. 25. Additionally, an oxide layer 106 has been deposited upon the non-doped wafer 100 using methods commonly known in the art. Oxide layer 106 is preferably deposited upon the non-doped wafer 100 to a thickness in the range of three to fifteen nanometers with a preferred thickness of ten nanometers. However, the present invention is not to be limited and it is to be appreciated that the oxide layer 106 may be of any thickness sufficient to provide the desired effects, including insulation, separation, and providing the base elements necessary for the growth or formation of various layers and/or structures.

The second step of the process flow of the second embodiment of the present invention preferably provides for the implantation of the junctions. In this preferred embodiment of the second process flow, NMOS junctions are implanted before PMOS junctions. However, the present invention is not to be so limited, either NMOS or PMOS junctions may be formed first without departing from the spirit or scope of the present invention. Additionally, while this embodiment of the present invention is disclosed in the context of the formation of a twin well transistor, it is to be understood that the present invention is not so limited, any active area 104 or 105 may be suitably configured to support the formation of an NMOS or a PMOS without departing from the spirit or scope of the present invention.

Figure 26:
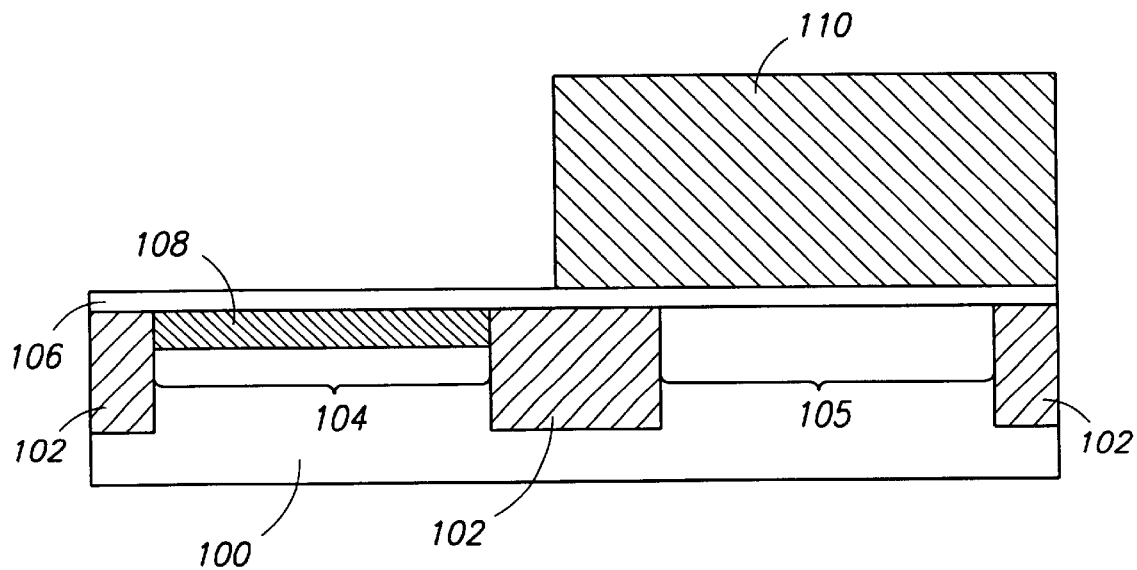
FIG. 26 is a schematic view of a cross-sectional representation of the wafer of FIG. 25 after implantation of an NMOS junction has occurred under the process flow of the second embodiment of the present invention.

When an NMOS junction is to be formed, a standard process mask 110 is suitably positioned above those regions of the non-doped wafer 100 within which a PMOS is to be formed. N++ ions are then implanted into the short active area 104, using known techniques, and an n++ junction 108 is formed, as shown in FIG. 26.

Figure 27:
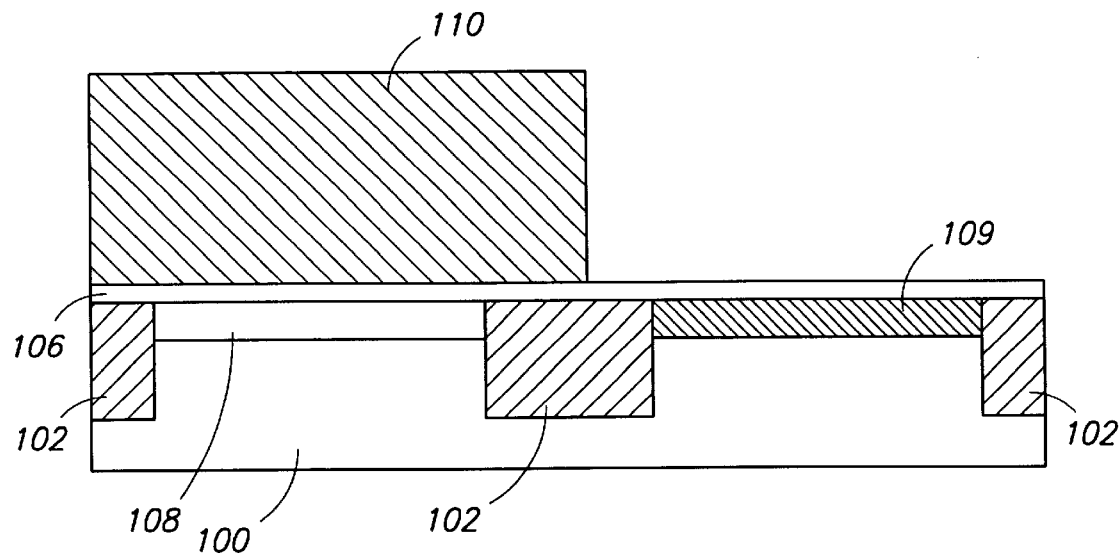
FIG. 27 is a schematic view of a cross-sectional representation of the wafer of FIG. 26 after implantation of a PMOS junction has occurred under the process flow of the second embodiment of the present invention.

Similarly when a PMOS junction is to be formed, a standard process mask 110 is suitably positioned above those regions within which the NMOS junctions were previously formed, as shown in FIG. 27. P++ ions are then implanted into the short active area 105, using known techniques, and a p++ junction 109 is suitably formed.

In addition to the implantation of the junctions 108 and 109, the process flow of the second embodiment of the present invention may also be optionally configured such that a deep well is implanted below each junction. However, in the preferred process flow of the second embodiment of the present invention deep well implantation occurs at a later stage in the process.

Figure 28:
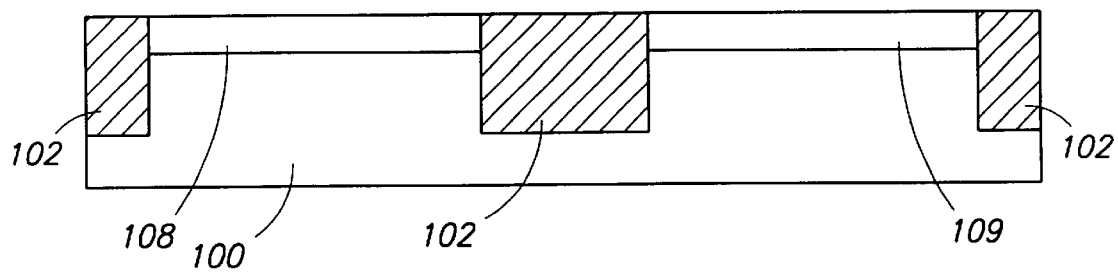
FIG. 28 is a schematic view of a cross-sectional representation of the wafer of FIG. 27 after etching of the sacrificial oxide has occurred under the process flow of the second embodiment of the present invention.

The third step of the second embodiment provides for the etching of the sacrificial oxide 106 and the pre-epitaxial baking of the structures formed up to this point, as shown in FIG. 28. The pre-epitaxial baking step preferably anneals the implanted junctions, thus any known baking process may be utilized which provides the time-temperature gradients needed to anneal the junction implants. Additionally, while the preferred process flow for this second embodiment of the present invention provides for a pre-epitaxial baking at this point in the process flow, it is to be understood that the baking and thereby the annealing of the junctions may occur at any time in the process flow prior to the growth of the channel material without departing from the spirit or scope of the present invention. However, by providing for the baking of the structure at this point in the process flow, the present invention preferably provides for the annealing of any junction implantation defects, and allows inspection and verification of acceptable junction formation early in the process flow.

Figure 29:
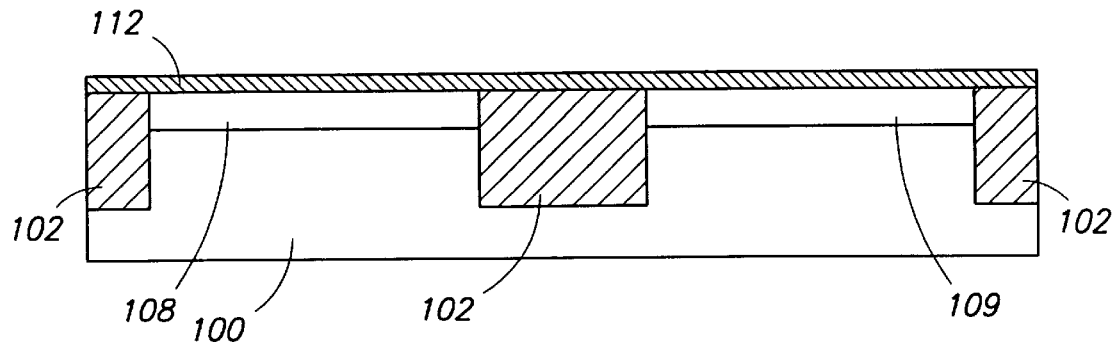
FIG. 29 is a schematic view of a cross-sectional representation of the wafer of FIG. 28 after deposition of a silicide has occurred under the process flow of the second embodiment of the present invention.

The fourth step of this embodiment preferably provides for the formation (preferably via CVD) of an epitaxial layer of a compatible conductive layer 112 (for example, $TiSi_2$ or TiN), as shown in FIG. 29. The CVD of a silicide is preferably performed using known techniques.

Figure 30:
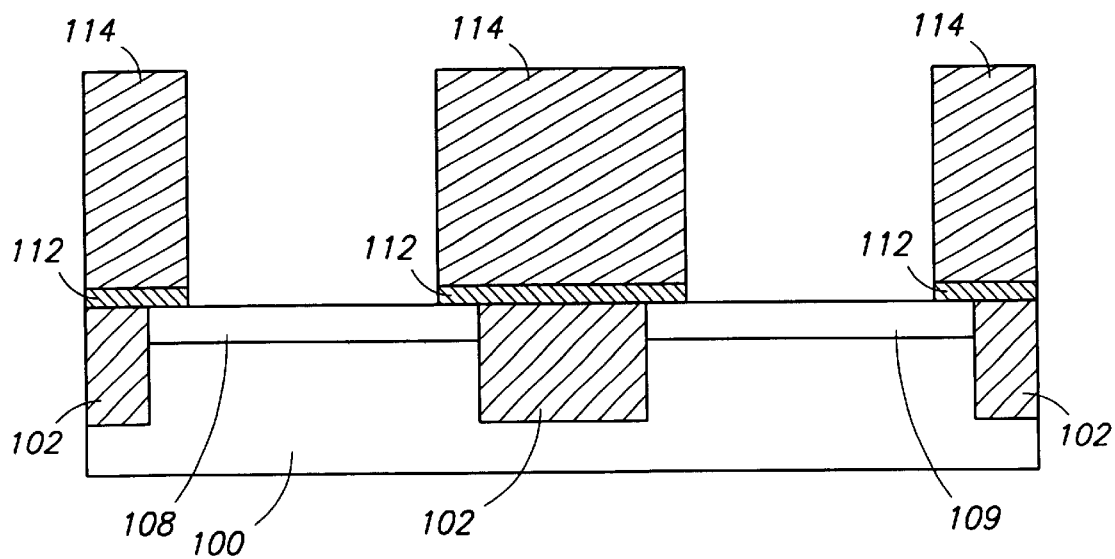
FIG. 30 is a schematic view of a cross-sectional representation of the wafer of FIG. 29 after the patterned selective etching of the silicide has occurred under the process flow of the second embodiment of the present invention.

After deposition of the silicide upon the structure, a photo-resist mask 114 is suitably positioned above those regions in which the conductive layer 112 is to remain. The remaining silicide (i.e., the silicide not under the mask 114) is suitably etched. Local interconnects are then preferably patterned and any remaining conductive layer 112 is suitably removed from the gate region, as shown in FIG. 30. The etching of the silicide and patterning of the local interconnects is suitably accomplished via known techniques.

Figure 31:
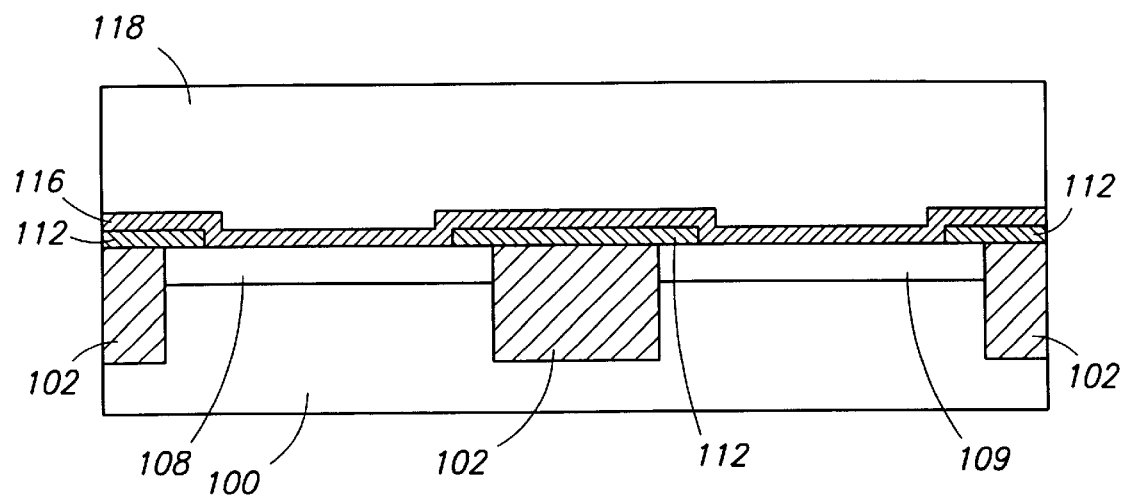
FIG. 31 is a schematic view of a cross-sectional representation of the wafer of FIG. 30 after the deposition of a sacrificial oxide and a layer of amorphous silicon has occurred under the process flow of the second embodiment of the present invention.
Figure 32:
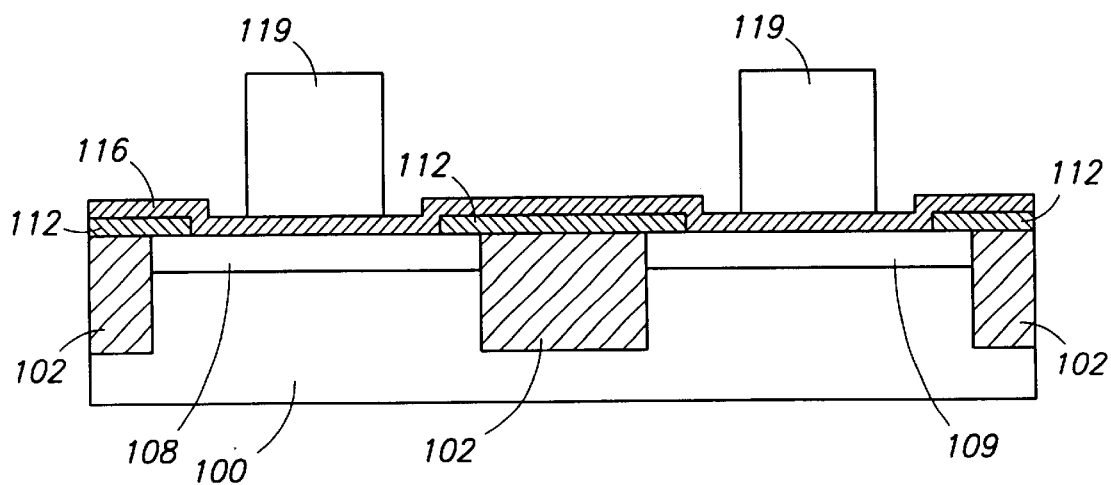
FIG. 32 is a schematic view of a cross-sectional representation of the wafer of FIG. 31 after the patterning of the sacrificial gates has occurred under the process flow of the second embodiment of the present invention.
Figure 33:
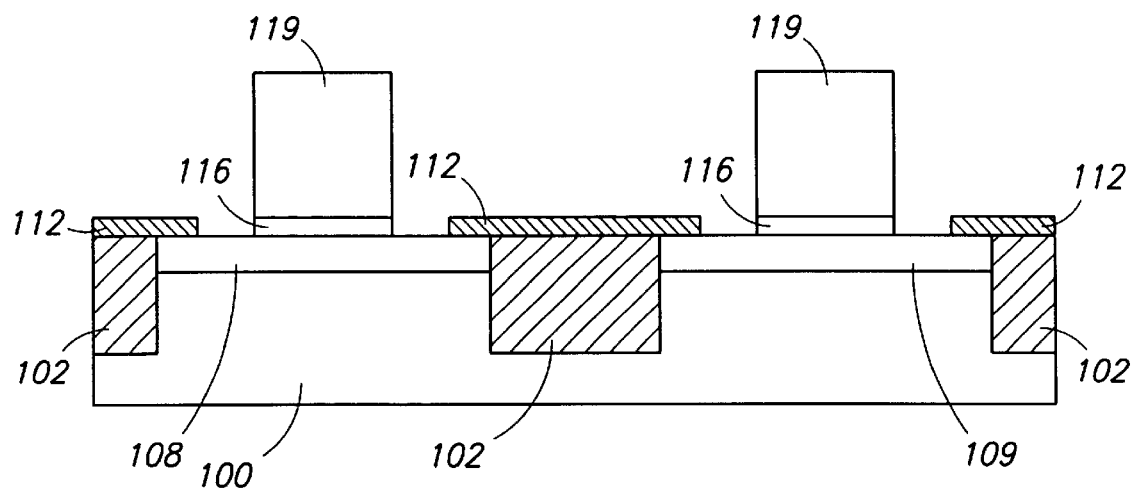
FIG. 33 is a schematic view of a cross-sectional representation of the wafer of FIG. 32 after the selective etching of the oxide has occurred under the process flow of the second embodiment of the present invention.
Figure 34:
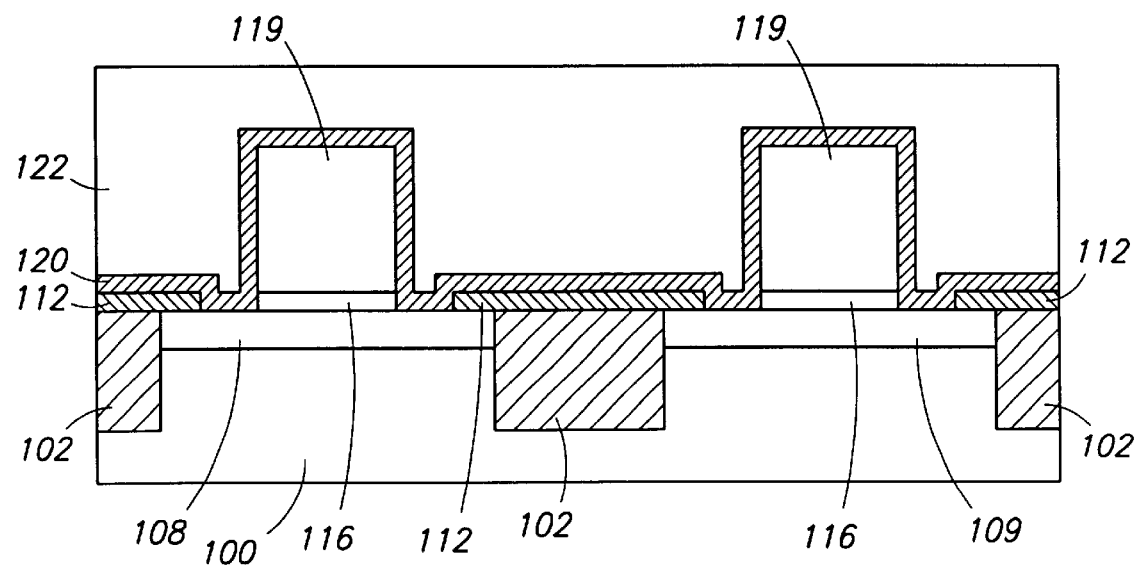
FIG. 34 is a schematic view of a cross-sectional representation of the wafer of FIG. 33 after the deposition of a nitride liner and an oxide has occurred under the process flow of the second embodiment of the present invention.
Figure 35:
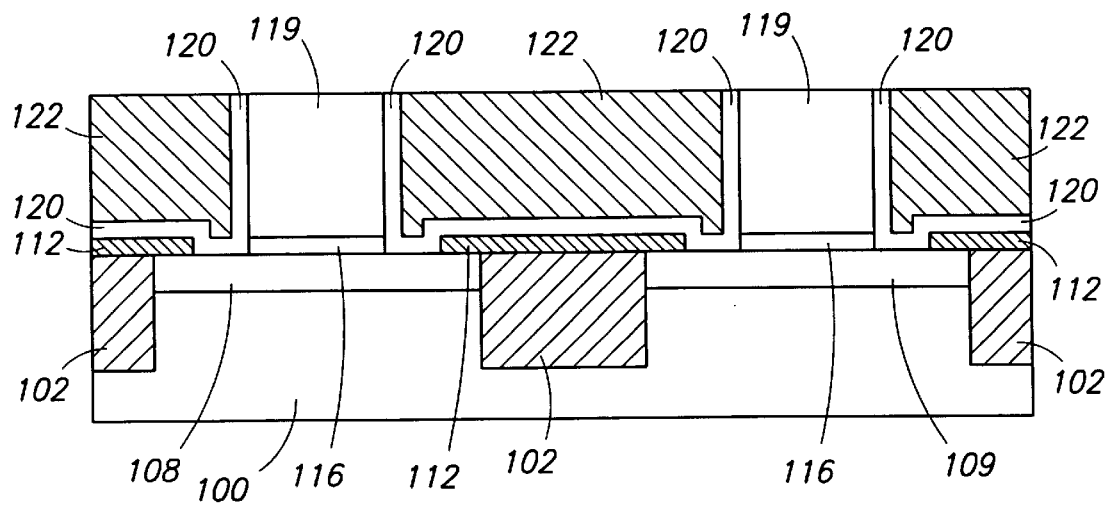
FIG. 35 is a schematic view of a cross-sectional representation of the wafer of FIG. 34 after planarization of the wafer has occurred under the process flow of the second embodiment of the present invention.

The sixth step of this embodiment may include a number of process steps for forming a sacrificial gate stack which is electrically isolated from the junction regions. While the present invention is described as encompassing a specific series of process steps, any combination of process steps which provide for the formation of an electrically isolated gate region while providing the desired structure above the junctions is considered to be within the scope of the present invention. In the preferred embodiment of this second embodiment of the present invention, these process steps include: (1) depositing (preferably via CVD) a suitably thin sacrificial oxide 116 (preferably $SiO_2$,), as shown in FIG. 31; (2) depositing (preferably via CVD) a poly-silicon layer 118 (such as Amorphous Silicon or "α-Si") on the sacrificial oxide 116; (3) suitably positioning a photo resist mask upon the device structure and selectively etching the poly-silicon layer 118 such that sacrificial gates 119 are formed, as shown in FIG. 32; (4) selectively etching the sacrificial oxide 116 against the conductive layer 112, junctions 108 and 109, and the sacrificial gates 119, as shown in FIG. 33; (5) depositing a dielectric insulator 120 (preferably SiN), as shown in FIG. 34; (6) filling in any trenches by depositing an oxide layer 122 (preferably $SiO_2$); and (7) CMP of the structure, preferably stopping on the sacrificial gate 119, as shown in FIG. 35. During the proceeding steps, the selective etching of the poly-silicon layer 118 which results in the sacrificial gates 119 is preferably the process step at which the particular gate length (and the generation of technology) is suitably determined. Thus, by using known deposition profiles a gate with a specific length may be achieved.

Figure 36:
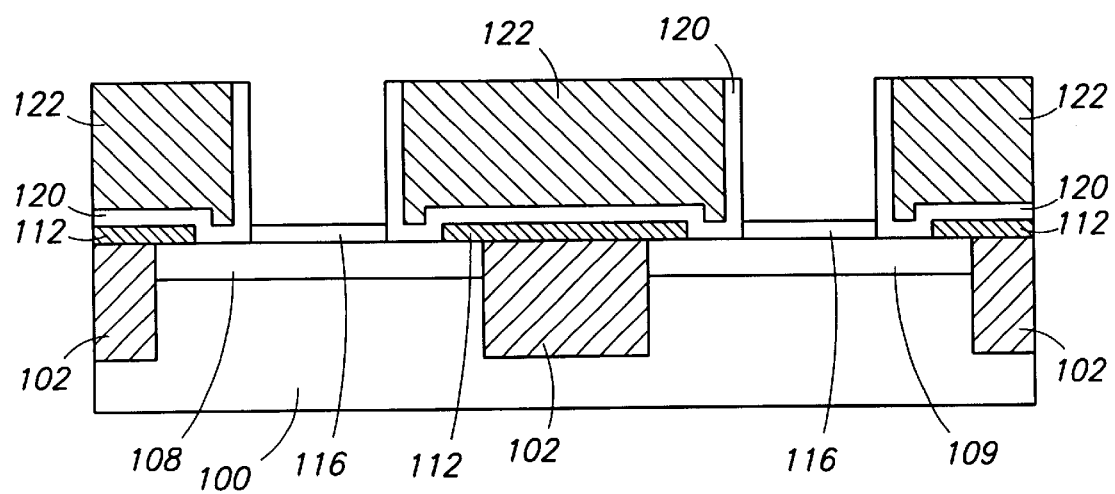
FIG. 36 is a schematic view of a cross-sectional representation of the wafer of FIG. 35 after the selective etching of the amorphous silicon has occurred under the process flow of the second embodiment of the present invention.
Figure 37:
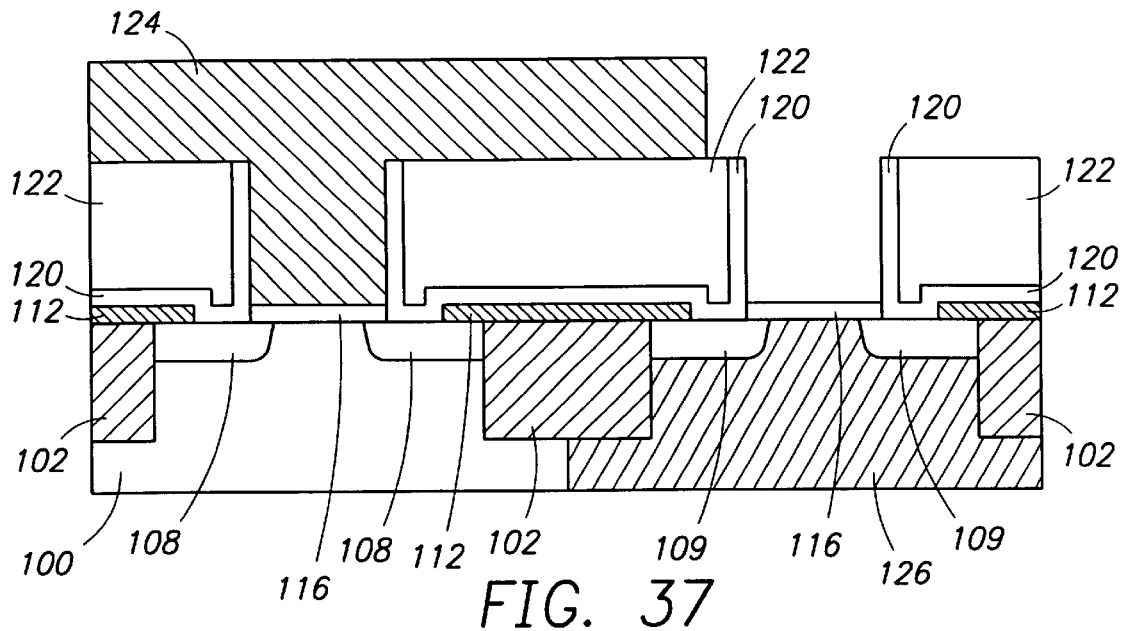
FIG. 37 is a schematic view of a cross-sectional representation of the wafer of FIG. 36 after the implantation of a PMOS well has occurred under the process flow of the second embodiment of the present invention.
Figure 38:
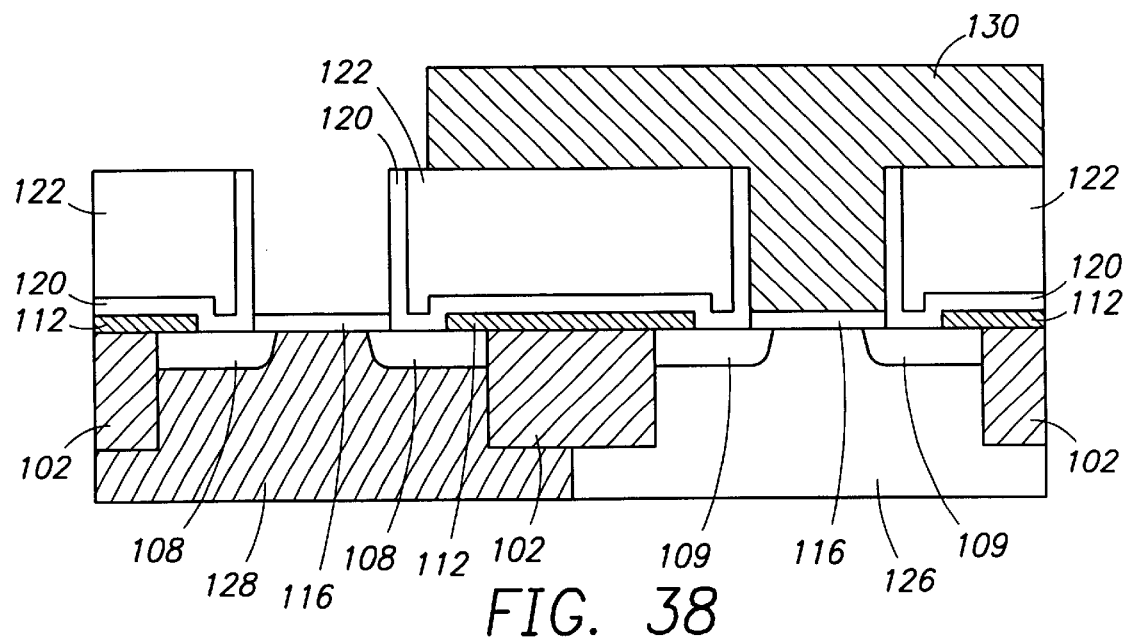
FIG. 38 is a schematic view of a cross-sectional representation of the wafer of FIG. 37 after the implantation of an NMOS well has occurred under the process flow of the second embodiment of the present invention.

The seventh step of the second embodiment of the present invention preferably provides for the selective etching of the sacrificial gate 119, as shown in FIG. 36. After etching, a mask 124 is suitably positioned such that a PMOS self-aligned local well 126 may be implanted, using known well implantation techniques, as shown in FIG. 37. Next, the mask 124 is suitably removed and the structure cleaned via known techniques. A mask 130 is then suitably positioned to provide the patterning necessary for the implantation of an NMOS self-aligned local well 138, using known techniques, as shown in FIG. 38. Preferably, the NMOS and PMOS self-aligned wells are formed such that shallow junctions do not arise. However, the process flow of the present invention may be suitably modified to form shallow junctions when desired, by suitably modifying the ionization energy, pattern, duration, and/or intensity of the do pants utilized in forming the junctions and the wells.

Figure 39:
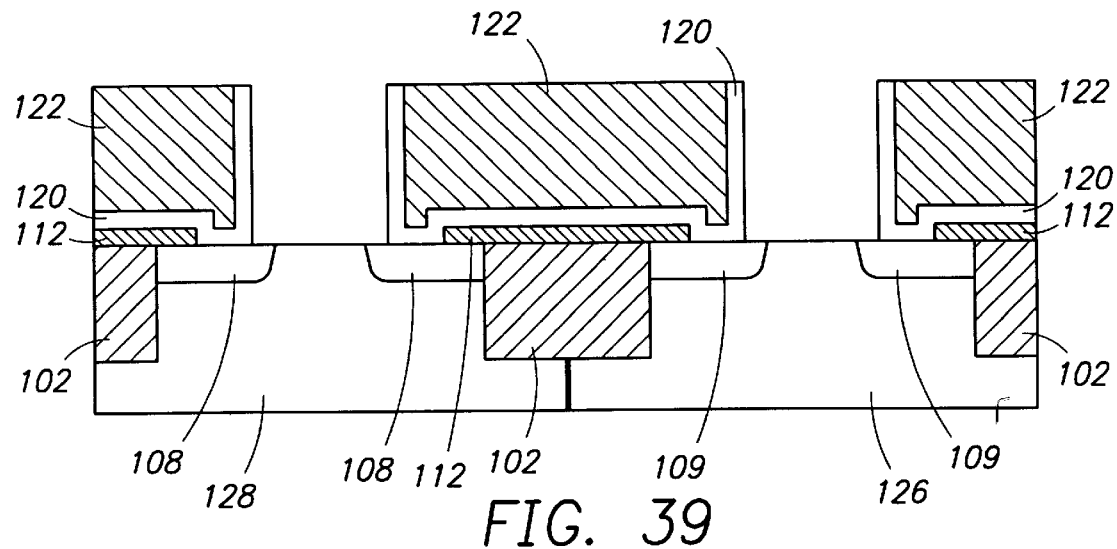
FIG. 39 is a schematic view of a cross-sectional representation of the wafer of FIG. 38 after the etching of the sacrificial oxide has occurred under the process flow of the second embodiment of the present invention.

The eighth step of the second embodiment of the present invention preferably provides for the removal of the sacrificial oxide 116 followed by the baking of the structure. Any suitable method of baking the structure may be utilized to electrically activate the well and anneal impurities in the well and/or junctions. The resulting structure is shown in FIG. 39. Thus, the present invention provides for the formation of the junctions and wells and subjects the structure to high thermal processing prior to the formation of the channel and the gate.

Figure 40:
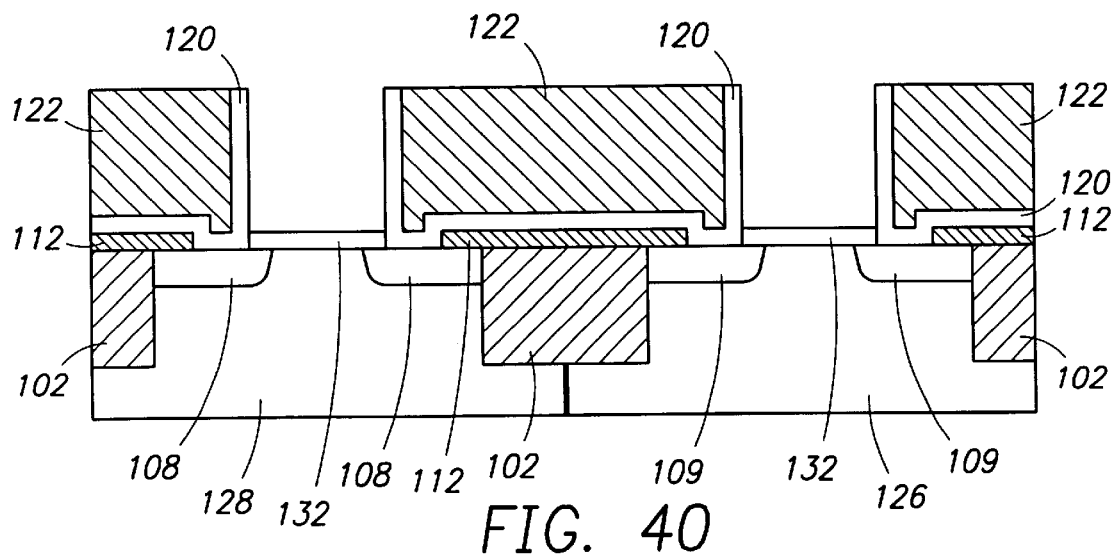
FIG. 40 is a schematic view of a cross-sectional representation of the wafer of FIG. 39 after the selective growth of the channel material has occurred under the process flow of the second embodiment of the present invention.

The ninth step provides for the low temperature epitaxial growth of the channel 132, as shown in FIG. 40. In a preferred embodiment, the channel 132 is an undoped film which provides for maximum electron and hole mobility. Since the present invention preferably does not expose the channel 132 to high temperatures, the channel 132 material may preferably be a silicon based alloy with a narrower band-gap and lower effective electron and hole masses. However, the present invention is not to be construed as being limited to silicon based alloys; any material which can be suitably deposited on silicon (and preferably, pseudo-morphically deposited on silicon) is considered to be within the scope of the present invention. In the preferred embodiment, the channel 132 material is preferably a SiGeC film.

Figure 41:
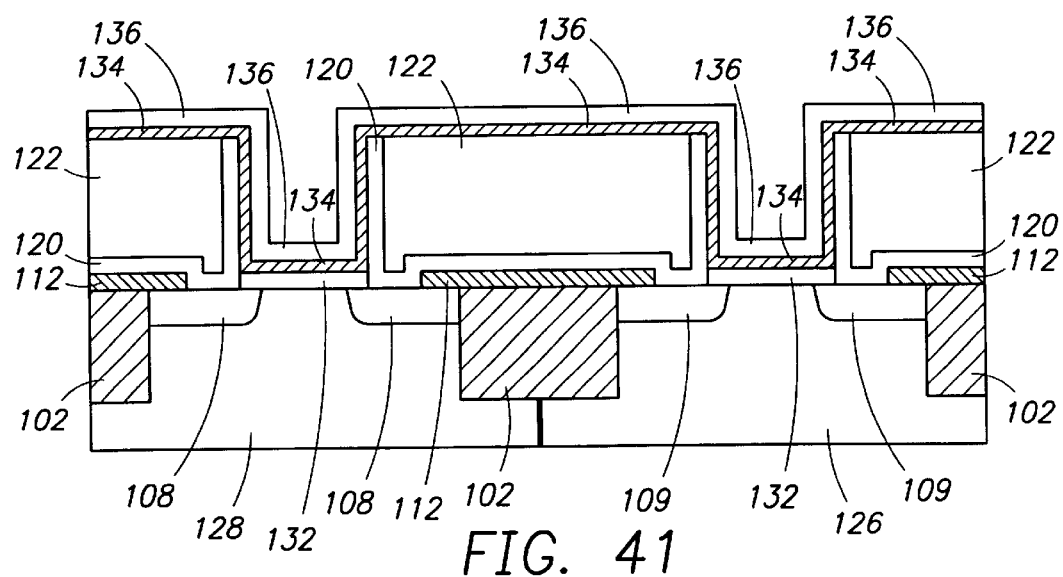
FIG. 41 is a schematic view of a cross-sectional representation of the wafer of FIG. 40 after the deposition of a gate insulator and a gate electrode has occurred under the process flow of the second embodiment of the present invention.

After the channel 132 material is deposited, the gate stack is preferably formed. In the current embodiment, the formation of the gate stack is a multi-step process. The first step of this process preferably is the deposition (preferably via CVD) of the gate insulator 134, as shown in FIG. 41. The gate insulator 134 is selected such that a very large capacitance is obtained. Metal oxides, including compounds such as $Ta_2O_5$ or $TiO_2$ (both of which may be suitably deposited via CVD), provide a larger capacitance than silicon dioxide and are preferably used as the gate insulator 134. The present invention allows metal oxides to be used as the gate insulator 134 because the process flow of the present invention does not expose the gate insulator 134 to the high temperatures commonly used to anneal implants. However, the present invention is not limited to the use of a metallic oxide as the gate insulator 134, any compound including silicon dioxides, silicon nitrides, or the like which provide the desired physical characteristics may be utilized.

After the deposition of the gate insulator 134, the formation of the gate stack preferably continues with the in-situ deposition of the gate electrode. The deposition of the gate electrode may constitute a multiple layer approach wherein more conductive metals are subsequently deposited upon previously deposited layers. Depending on the gate insulator 134 chosen, the conductivity of the gate electrode, and the electrical insulation needed, various layers of gate electrodes may be used. However, in this embodiment of the present invention, a two layer gate electrode is preferably utilized.

Figure 42:
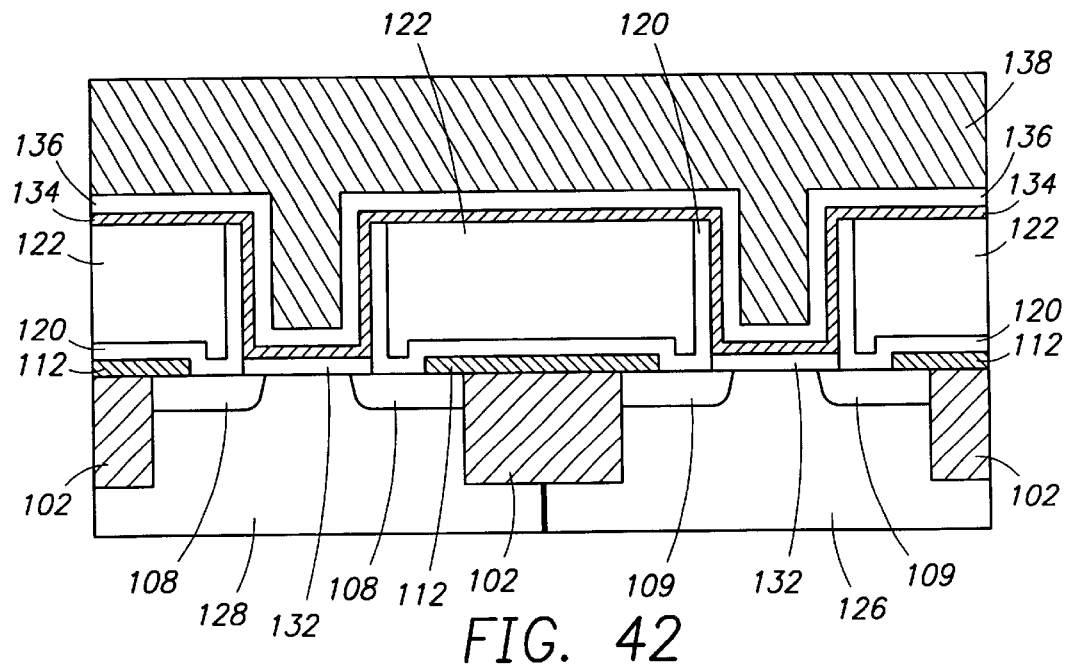
FIG. 42 is a schematic view of a cross-sectional representation of the wafer of FIG. 41 after the deposition of a second gate electrode has occurred under the process flow of the second embodiment of the present invention.

As shown in FIG. 42, a first layer 136 of the gate electrode may be a barrier metal such as TiN or TaSiN which may be suitably deposited (preferably via CVD) upon the gate insulator 134. The second layer 138 of the gate electrode may be any material which provides the desired electrical conductivity, including poly-silicon compounds. Preferably, the gate electrode is composed of highly conductive metal such as tungsten, copper, or the like. By providing for the formation of the gate stack after the implantation and thermal processing of the wells and junctions, the present invention preferably allows pure metals to be utilized as the gate electrode without concern as to the diffusion, evaporation, or destruction of the metals by later processes.

Figure 43:
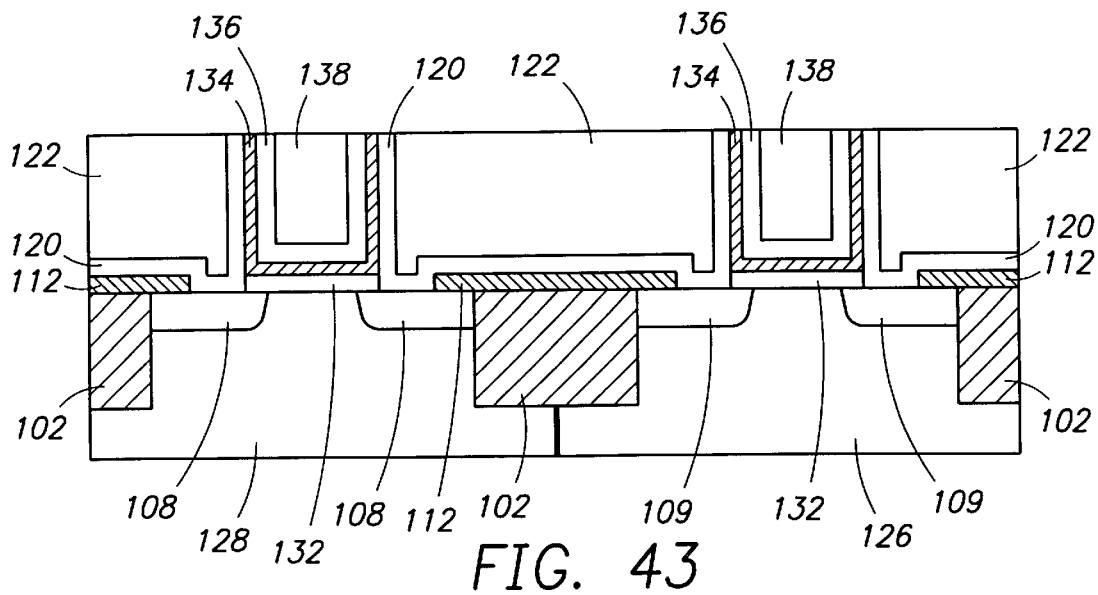
FIG. 43 is a schematic view of a cross-sectional representation of the wafer of FIG. 42 after the planarization of the gate electrode has occurred under the process flow of the second embodiment of the present invention.

The final process steps of this second embodiment of the present invention provides for the planarization of the devices structure, as shown in FIG. 43. Preferably planarization is performed until the oxide layer 122 is reached. Planarization may be performed via any method known in the art, and preferably via CMP.

Figure 44:
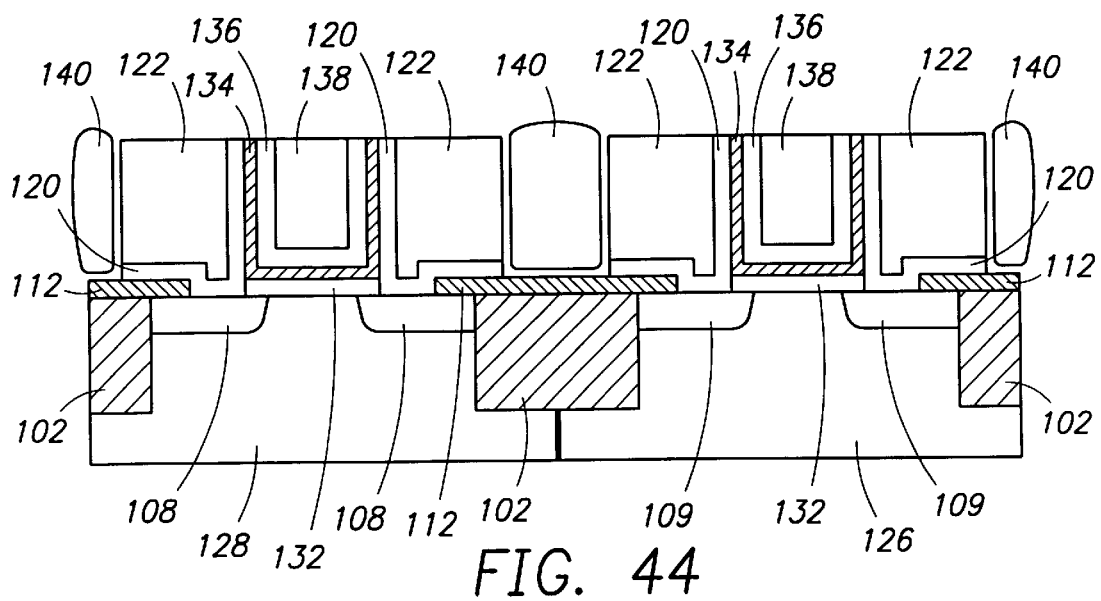
FIG. 44 is a schematic view of a cross-sectional representation of the wafer of FIG. 43 after the formation of contact holes has occurred under the process flow of the second embodiment of the present invention.
Figure 46A:
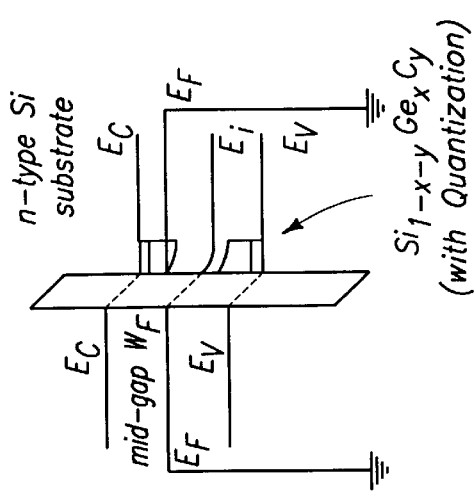
FIG. 46 is a series of band-gap diagrams which show the band-gap narrowing and reduced threshold gate voltages which can be realized for a p-channel device under either process flow of the present invention.
Figure 46B:
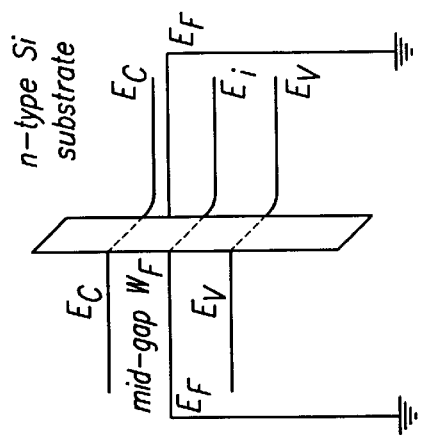
Figure 46C:
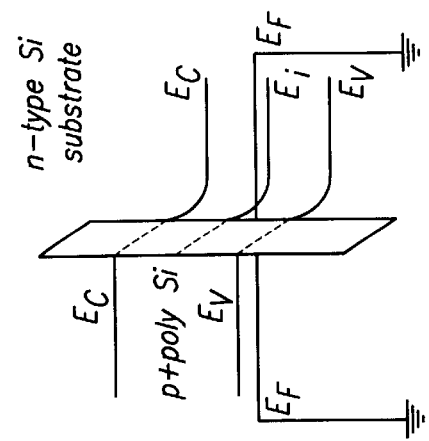
Figure 46D:
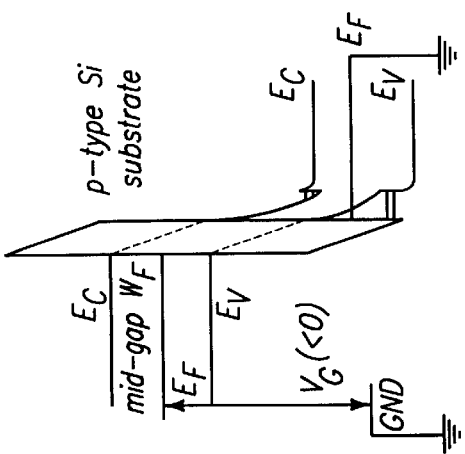
Figure 46E:
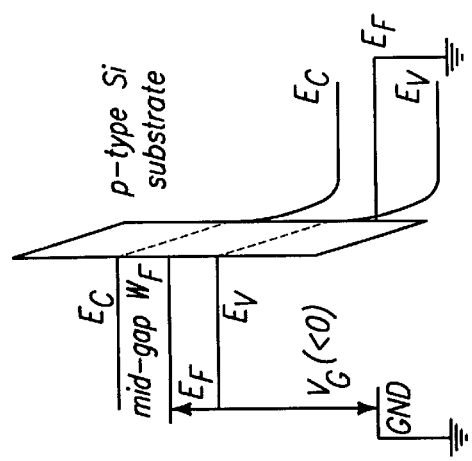
Figure 46F:
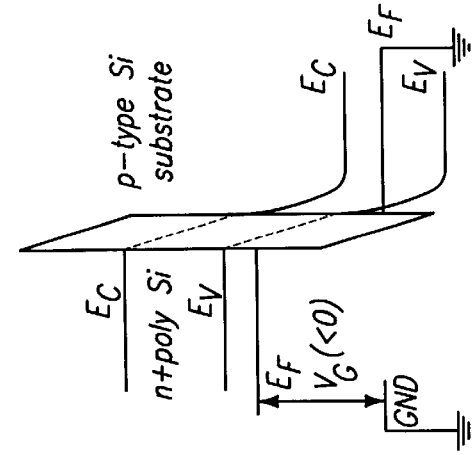

Lastly, as shown in FIG. 44, contacts openings 140 over the source and drain junction fields may be suitably etched. At this point the device is ready for subsequent processing (including metallization also known as back-end processing) using known in the art techniques.

While the process flows of the first and second embodiments of the present invention have been described in detail, it is to be understood that any of the process steps may be rearranged, reorganized, or accomplished in a different process flow pattern, manner, or method without departing from the spirit or scope of the present invention, provided the formation of the channel and the gate stack occurs after the high temperature processing of the device structure has been accomplished. For example, CMP of the gate electrodes and insulators could be suitably replaced by one skilled in the art with a patterning step (lithography followed by a dry etch). A patterning step would result in a "T" shaped gate, wherein the gate contact is on top of the gate itself rather than on a contact pad over the field isolation regions. Consequently, by using a "T" gate, MOSFETs can be more compactly placed and a lower gate electrode resistance may be obtained.

The process flows of the present invention also significantly reduce the concern of impurities arising in the channel region (i.e., where the transport of electrons and holes takes place). Since the junctions are preferably implanted before the local well is formed, impurities which arise in the well region can be suitable annealed or similarly reduced and/or eliminated using known techniques. Thus, the present invention preferably provides a channel region in which a low concentration (if any) of impurities exist and a high mobility of electrons and holes can arise.

Another advantage of the process flows of the present invention, is that it allows silicon-based alloys to be used as the channel material. Silicon-based alloys commonly have narrower band-gaps and charge carriers (i.e., electrons and holes) with lower effective masses, higher mobility, and a lower density of states. As is known in the art, materials with narrower band-gaps and charge carriers with lower effective masses require less threshold voltage to be excited. Thus, by providing a channel material with the above characteristics, the process flows of the present invention allow a reduction to occur in the threshold voltage necessary to operate the MOSFET. For example, a device 240 produced under the standard process flow with a p-type silicon substrate 204, a gate insulator 200, and an n+ poly-silicon gate electrode 202 commonly has band-gap with a relatively steep profile, as shown in the band-gap energy diagram in FIG. 45a. FIG. 45d shows the device of FIG. 45a when a threshold gate voltage $V_{G1}$ is applied to the n+ poly-silicon gate electrode 202. A band-gap energy diagram for a semiconductor device generally shows the increased energy at the gate electrode (which translates into the threshold voltage) necessary to excite through the gate insulator 200 the electrons in the substrate 204 from the valence band ($E_v$) to the conduction band ($E_c$); wherein $E_F$ is the Fermi level (i.e., the energy at which the probability of an electron occupying either the conduction band or the valence band is fifty percent), and $E_i$ is the Fermi level of an intrinsic semiconductor (i.e. an ideal device which has few impurities).

When the n+ poly-silicon gate electrode 202 in device 240 is replaced by a gate electrode with a mid-gap work function 206, as shown in FIG. 45b, the bending 212 in the channel formed in the substrate 204 is reduced and the surface potential for device 250 is higher than the surface potential for device 240 (i.e. $E_c$ is below $E_F$ for device 240, and $E_c$ is above $E_F$ for device 250) and a higher threshold voltage occurs, as shown in FIG. 45e by the higher threshold gate voltage $V_{G2}$) necessary to reach the Fermi level, $E_F$ (i.e., $V_{G2}$ is greater than $V_{G1}$).

By delaying the formation of the channel until after the junctions and wells have been implanted and thermally processed, the present invention allows a channel 208 with a band-gap narrower than silicon to be utilized. As shown in FIGS. 45c and 45f, the channel 208 lowers the surface potential on the semiconductor such that a lower threshold gate voltage $V_{G3}$ may be utilized to activate the device 260 (i.e., $V_{G3}$ is approximately equal to $V_{G1}$ and $V_{G3}$ is less than $V_{G2}$). Similarly, FIGS. 46a–f depict the band diagrams for an n-type silicon substrate, and reflects the gate voltages, band bending, and the like which occurs when a p-channel device is produced. As shown, the advantages of the present invention are also realized in a PFET by using a mid-gap workfunction gate electrode and a channel having a band-gap narrower than silicon.

In a preferred embodiment under the process flow of the present invention, a device is produced in which the same surface potential exists at both the gate oxide and the channel. Such an ideal device would have a metal gate electrode with a mid-gap workfunction while providing a low threshold gate voltage. Such an ideal device could be produced using, for example, $Si_{1-x}Ge_x$ and $Si_{1-y}C_y$ films as the channel material.

Although the present invention has been described in conjunction with two separate embodiments, the scope of the invention is not limited to either embodiment. Modification may be made to the process flow, techniques, materials used, or any other element, factor, step, or the like of either embodiment without departing from the spirit or scope of the present invention as expressed in the following claims.

What is claimed is:

1. A semiconductor device comprising a metallic gate electrode, junctions, well, and a channel fabricated on a silicon wafer above said junctions, wherein said channel is less than about 0.13 microns long, and said gate is formed after implantation of both said well and said junctions into said silicon wafer and the deposition of said channel upon said silicon wafer.

2. The semiconductor device of claim 1 wherein said gate comprises a gate insulator having a high dielectric constant.

3. The semiconductor device of claim 1 wherein said gate comprises a gate insulator comprising a metal oxide.

4. The semiconductor device of claim 1 wherein said gate electrode comprises a first layer and a second layer.

5. The semiconductor device of claim 4 wherein said first layer comprises a barrier metal and said second layer comprises a bulk metal.

6. The semiconductor device of claim 1 wherein said gate electrode comprises a bulk metal.

7. A semiconductor device having a channel elevated above a source junction and a drain junction implanted into a wafer, said channel comprising a non-doped channel film.

8. The semiconductor device of claim 7 wherein said channel film is deposited on said wafer after annealing a well and said source junction and said drain junction implanted into said wafer.

9. The semiconductor device of claim 8 wherein said non-doped channel film is a silicon based alloy.

10. The semiconductor device of claim 8 wherein said non-doped channel film has a narrower band-gap than silicon, thereby allowing fabrication of a semiconductor device with a lower threshold voltage than that achievable with just a silicon film.

11. A semiconductor device comprising:
 a semiconductor wafer;
 a source and drain junction implanted in said wafer;
 a well implanted in said wafer;
 a sacrificial gate formed on said wafer in a location where a subsequent final gate is to be formed;
 a channel formed in said location of said sacrificial gate upon removal of said sacrificial gate and after said junction and said well are formed, thereby allowing said channel to be elevated above said junction and said well; and
 an final gate formed after said channel formation, said final gate comprising multiple layers.

12. The semiconductor device of claim 11 further comprising a gate insulator having a high dielectric constant.

13. The semiconductor device of claim 11 wherein said well comprises a deep well and a local well.

14. The semiconductor device of claim 11 wherein said final gate comprises a metallic gate electrode.

15. The semiconductor device of claim 14 wherein said final gate comprises a barrier metal.

16. The semiconductor device of claim 11 wherein said junction comprises a steep junction implanted in a single process.

17. The semiconductor device of claim 11 comprising an undoped channel film.

18. The semiconductor device of claim 17 wherein said film comprises a silicon based alloy.

19. The semiconductor device of claim 18 wherein said film comprises $Si_{1-x}Ge_x$ or $Si_{1-y}C_y$.

20. The semiconductor device of claim 12 wherein said gate insulator comprises a metal oxide.

21. The semiconductor device of claim 19 wherein said gate insulator comprises $Ta_2O_5$ or $TiO_2$.

22. The semiconductor device of claim 11 wherein said final gate comprises two layers, said first layer comprising a barrier metal and said second layer comprising a bulk metal.

* * * * *